US012601762B2

(12) United States Patent
Peng et al.

(10) Patent No.: US 12,601,762 B2
(45) Date of Patent: Apr. 14, 2026

(54) TEST TERMINAL

(71) Applicant: F TIME TECHNOLOGY INDUSTRIAL CO., LTD., New Taipei City (TW)

(72) Inventors: Chang-Lin Peng, New Taipei City (TW); Chih-Min Peng, New Taipei City (TW); Yu-Han Huang, New Taipei City (TW)

(73) Assignee: F Time Technology Industrial Co., Ltd., New Taipei City (TW)

( * ) Notice: Subject to any disclaimer, the term of this patent is extended or adjusted under 35 U.S.C. 154(b) by 246 days.

(21) Appl. No.: 18/637,644

(22) Filed: Apr. 17, 2024

(65) Prior Publication Data

US 2025/0327837 A1 Oct. 23, 2025

(51) Int. Cl.
G01R 1/073 (2006.01)
G01R 1/067 (2006.01)
(52) U.S. Cl.
CPC ..... G01R 1/07364 (2013.01); G01R 1/06733 (2013.01); G01R 1/07314 (2013.01)
(58) Field of Classification Search
CPC ............ G01R 1/07364; G01R 1/06733; G01R 1/07314
See application file for complete search history.

(56) References Cited

U.S. PATENT DOCUMENTS 3,725,849 A * 4/1973 Becke .................. H01R 24/542
439/363
4,908,571 A * 3/1990 Stoehr ................ G01R 1/07392
324/762.01

9,500,674 B2 11/2016 Cheng et al.
10,103,486 B1 * 10/2018 Yan .......................... H01R 4/36
10,424,866 B1 * 9/2019 Peng ...................... H01R 24/50
2004/0043653 A1 * 3/2004 Feldman ............ G01R 1/07314
439/219
2008/0303138 A1 * 12/2008 Flett ...................... H01L 25/071
257/E23.098
2011/0244720 A1 * 10/2011 Peng ...................... H01R 24/44
439/578
2020/0100541 A1 * 4/2020 Ouyang .................. A24F 40/40

FOREIGN PATENT DOCUMENTS

CN 205749596 U 11/2016
JP 6737518 B2 8/2020
TW I606239 B 11/2017

* cited by examiner

*Primary Examiner* — Paresh Patel
(74) *Attorney, Agent, or Firm* — Rosenberg, Klein & Lee

(57) ABSTRACT

A test terminal has a connecting assembly and at least one probe assembly. The connecting assembly has a first connecting unit and a second connecting unit. The first connecting unit has an installation hole and the second connecting unit has a limit space. The probe assembly includes a main sleeve, a connecting sleeve, a probe module, and a buffering module. The main sleeve is mounted through the installation hole and the limit space. The main sleeve has a channel and an abutting part mounted on an outer annular surface. The connecting sleeve is sleeved on the main sleeve and mounted through the installation hole. The probe module is mounted in the channel. The buffering module is mounted on the main sleeve and abuts the second connecting unit. The connecting sleeve and the buffering module together clamp the second connecting unit, facilitating ease in installing and removing the probe assembly.

16 Claims, 23 Drawing Sheets

10

20

111B

11B

12B

20

TEST TERMINAL

BACKGROUND

1. Field of the Invention

The present invention relates to a test terminal, especially to a test terminal of a circuit test machine.

2. Description of the Prior Arts

A circuit test machine is an apparatus to check whether electronic signals of a circuit are conducted normally in a product to be tested. In the circuit test machine, a test terminal is fixed on a base, and the test terminal has two test ends. One of the two test ends is connected to a test head of the circuit test machine, and another one of the test ends is inserted into the product. When connecting the test terminal to the product, the test head of the circuit test machine would press the test terminal toward the product. Generally speaking, a spring is introduced into the test terminal, and the spring is capable of compressing and stretching along the pressing direction of the test head to prevent the product from being damaged by pressing, and further ensure the test terminal contacts the product.

The pressing travel of the test head may be too shallow or too deep owing to setting errors, which may lead to system errors or even damage the product. However, the pressing travel of the test head can not be easily checked by the staff, thus being unable to remedy in time.

Furthermore, there may be more than one probe module on one single test terminal. To be more precise, multiple probe modules are encapsulated as a cluster and then connected to the base of the circuit test machine, and therefore, the whole cluster of the probe modules needs to be replaced together even if there is only one single probe module out of order, which is not environmentally friendly and causes wastes.

Besides, a radio-frequency cable connector is usually utilized in the test head to insert into the test terminal, and such connector needs to be fixed after inserted to avoid falling off and instability of electrical characteristics. Conventionally, a screw is laterally mounted through the test terminal and abuts the radio-frequency cable connector to fix the radio-frequency cable connector. However, the radio-frequency cable connector may be damaged if the screw is mounted too deep; on the other hand, the radio-frequency cable connector may fall off if the screw is mounted too shallow.

To overcome the shortcomings, the present invention provides a test terminal to mitigate or obviate the aforementioned problems.

SUMMARY

The main objective of the present invention is to provide a test terminal that has a probe assembly capable of being removed from and installed on a connecting assembly.

The test terminal has a connecting assembly and at least one probe assembly. The connecting assembly includes a first connecting unit and a second connecting unit. The first connecting unit has a top surface and a bottom surface opposite to each other, and at least one installation hole is formed through the top surface and the bottom surface. The second connecting unit is connected to the first connecting unit, and the second connecting unit has at least one limit space, the at least one limit space and the at least one installation hole fluidly communicates with each other. The at least one probe assembly each includes a main sleeve, a connecting sleeve, a probe module, and a buffering module. The main sleeve is detachably mounted through the at least one installation hole of the first connecting unit and the at least one limit space of the second connecting unit. The main sleeve has a channel and an abutting part. The channel is formed along a length direction of the main sleeve and through two opposite ends of the main sleeve. The abutting part is mounted on an outer annular surface of the main sleeve, the abutting part has an abutting surface facing to the connecting assembly. The connecting sleeve is sleeved on the main sleeve and mounted through the installation hole of the first connecting unit. The probe module is mounted in the channel of the main sleeve. The buffering module is mounted on the main sleeve and is capable of compressing and stretching along the length direction of the main sleeve. The buffering module has two opposite end portions, one of the end portions abuts the abutting surface of the abutting part, and another one of the end portions abuts the second connecting unit. Wherein, the second connecting unit is detachably clamped and fixed between the connecting sleeve and the buffering module.

With the connecting sleeve and the buffering module together clamping the connecting assembly to fix the probe assembly, the probe assembly is capable of being removed from or installed on the connecting assembly easily. Therefore, when the test terminal has several probe assemblies and some of the probe assemblies are broken, the user may only replace the broken probe assemblies instead of the whole test terminal, thus reducing the cost and the waste, and being environmentally friendly.

Other objectives, advantages and novel features of the invention will become more apparent from the following detailed description when taken in conjunction with the accompanying drawings.

DETAILED DESCRIPTION

Figure 1:
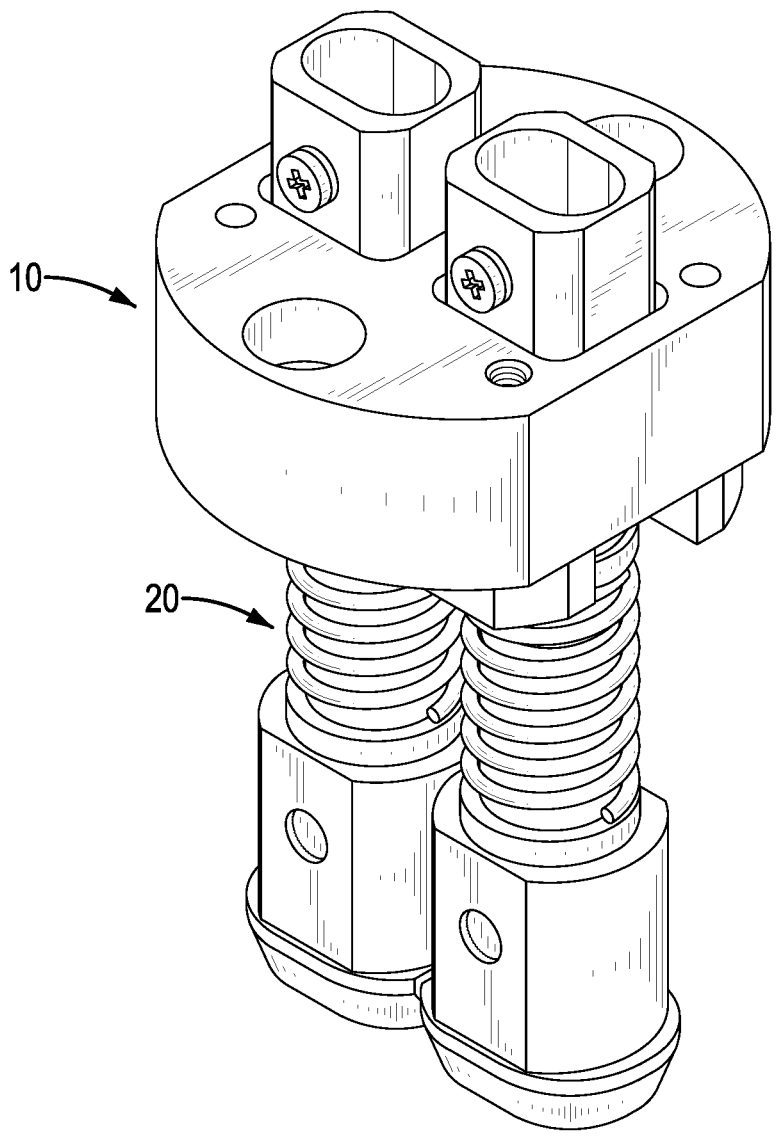
FIG. 1 is a perspective view of a first embodiment of a test terminal in accordance with the present invention.
Figure 2:
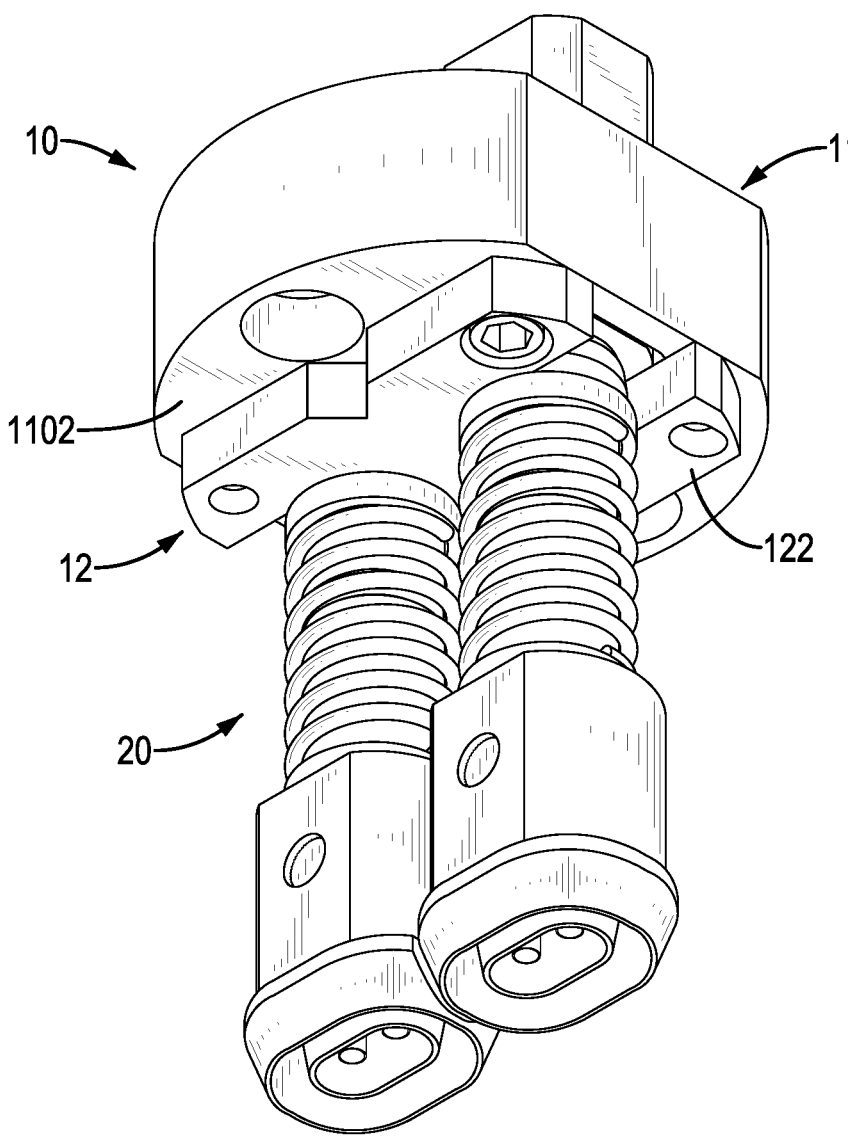
FIG. 2 shows the test terminal of FIG. 1 viewed from another angle.

With reference to FIGS. 1 and 2, a first embodiment of a test terminal in accordance with the present invention includes a connecting assembly 10 and two probe assemblies 20, but a number of the probe assemblies 20 is not limited thereto.

Figure 3:
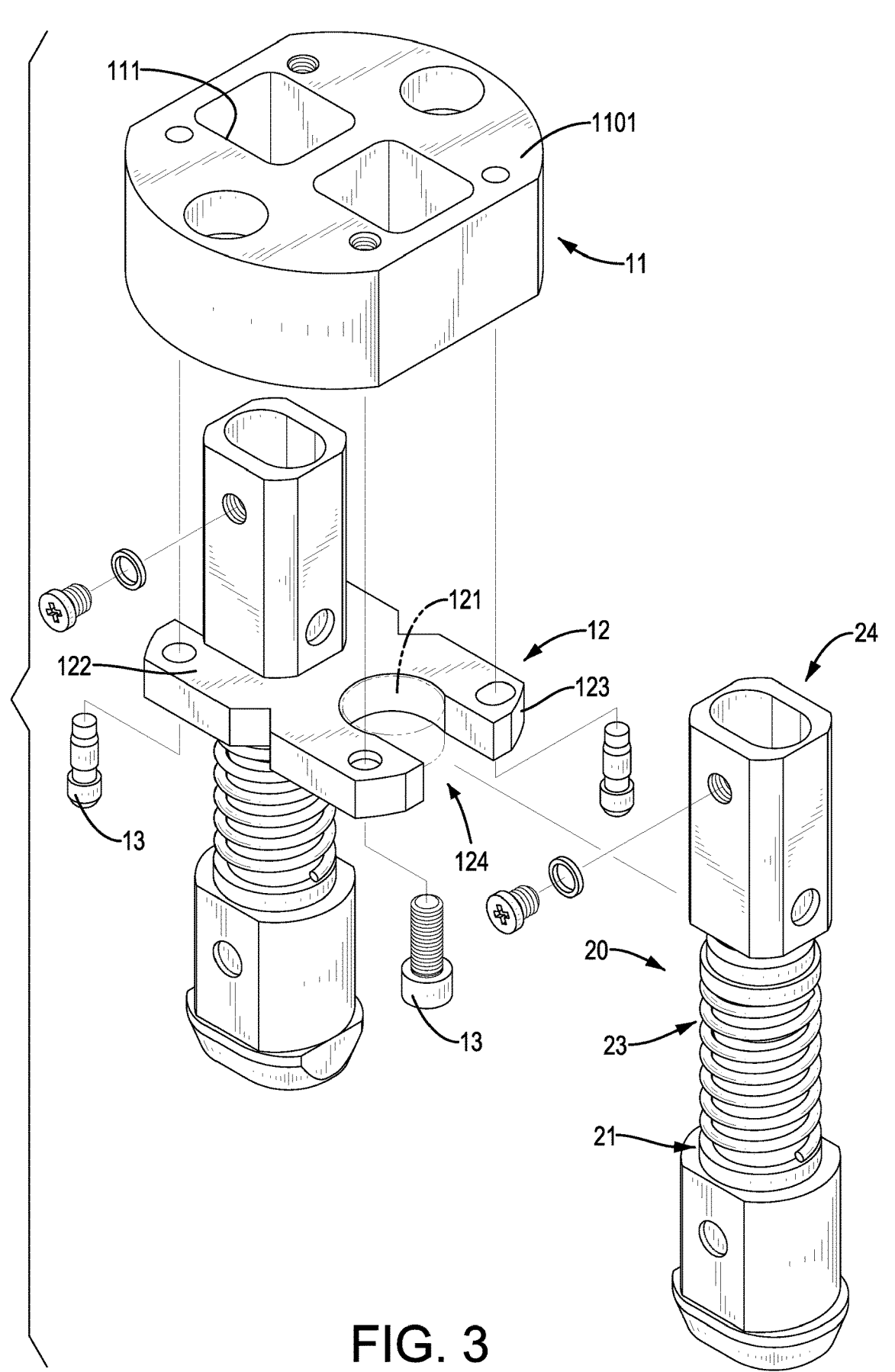
FIG. 3 is an exploded view of the test terminal in FIG. 1.
Figure 4:
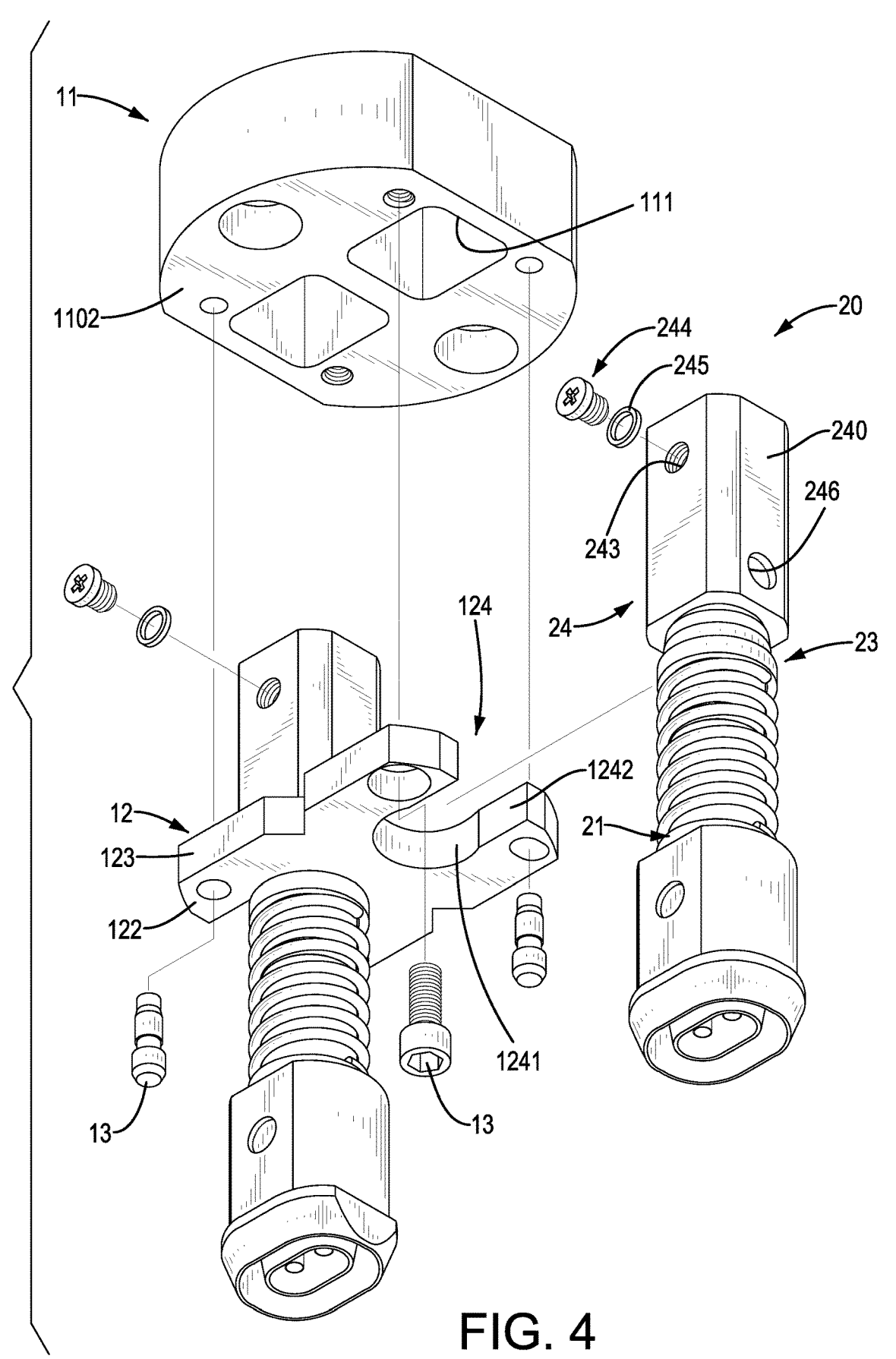
FIG. 4 shows the test terminal of FIG. 3 viewed from another angle.
Figure 5:
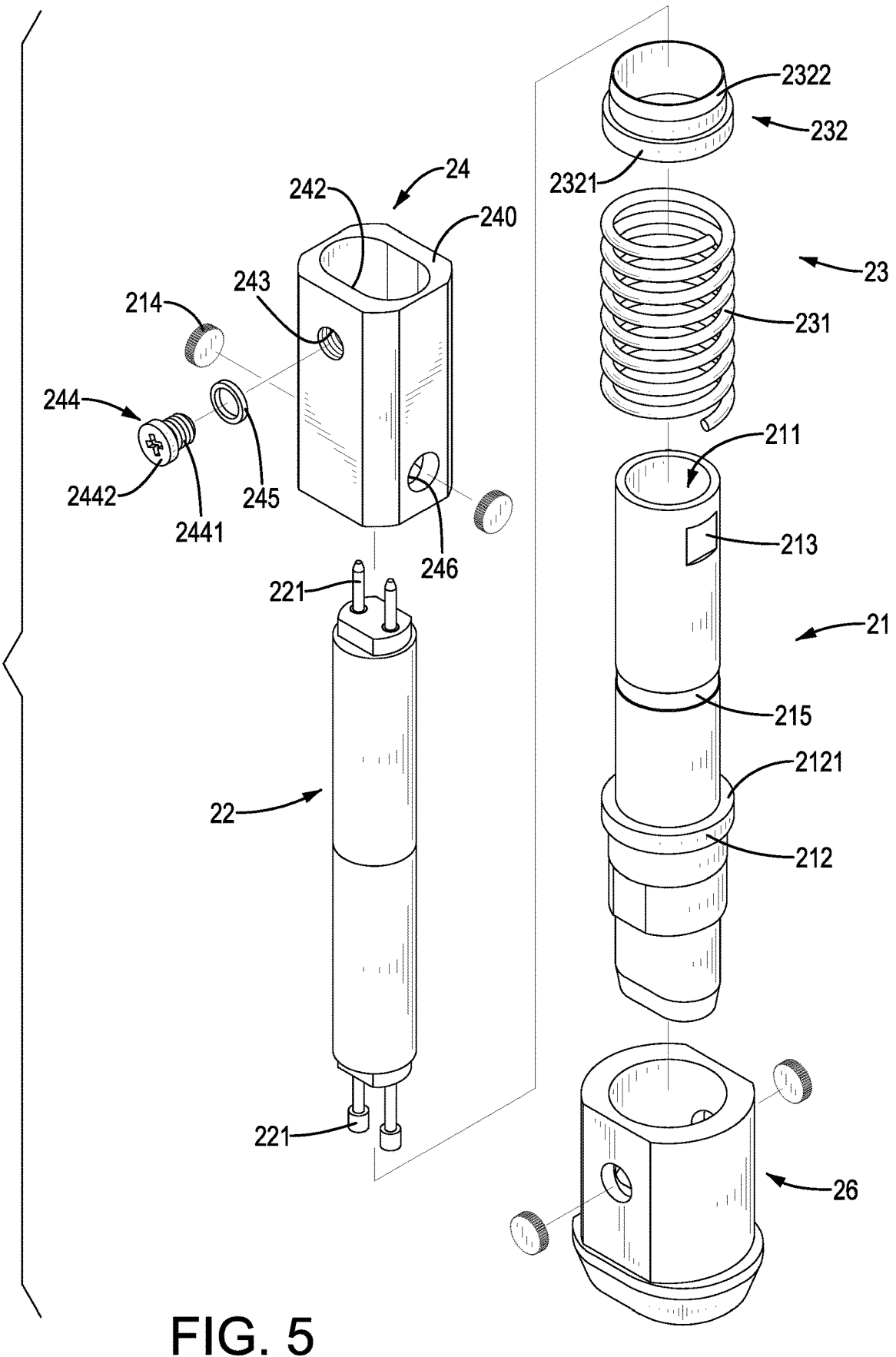
FIG. 5 is an exploded view of a probe assembly of the test terminal in FIG. 1.
Figure 6:
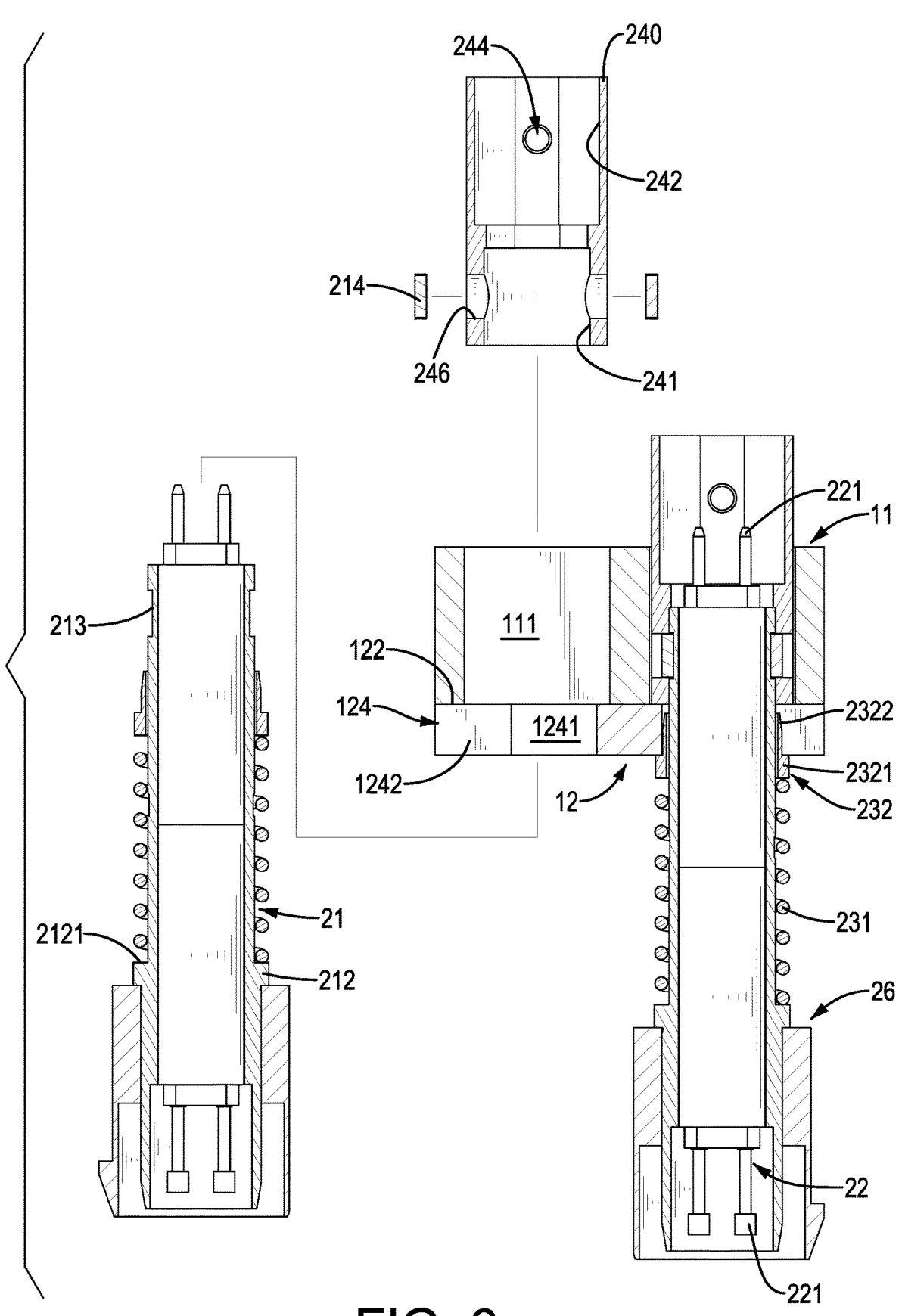
FIG. 6 is a partial exploded lateral cross-sectional view of the test terminal in FIG. 1.

With reference to FIGS. 2 to 4, the connecting assembly 10 has a first connecting unit 11 and a second connecting unit 12. The first connecting unit 11 is a block, and the first connecting unit 11 has a top surface 1101 and a bottom surface 1102 opposite to each other. Each one of at least one installation hole 111 is formed on the first connecting unit 11, and the installation hole 111 is formed through the top surface 1101 and the bottom surface 1102. In this embodiment, the first connecting unit 11 has two installation holes 111.

The second connecting unit 12 is detachably connected to the first connecting unit 11. The second connecting unit 12 has at least one limit space 121, and the limit space 121 and the installation hole 111 fluidly communicate with each other.

In this embodiment, the second connecting unit 12 is a board configured to limit positions. The second connecting unit 12 has two limit spaces 121, two flat surfaces 122 opposite to each other, an outer lateral surface 123, and two limit recesses 124. One of the two flat surfaces 122 of the second connecting unit 12 is connected to the bottom surface 1102 of the first connecting unit 11. In this embodiment, the bottom surface 1102 of the first connecting unit 11 and the flat surface 122 of the second connecting unit 12 fit with each other, and the second connecting unit 12 is fixed on the first connecting unit 11 via multiple locking units 13 mounted on the second connecting unit 12 and fixed on the first connecting unit 11, but it is not limited thereto. Besides, the type of the locking units 13 may be selected as desired, and different types of the locking units 13 may be introduced at a same time as well.

The outer lateral surface 123 connects with the two flat surfaces 122, and each one of the limit spaces 121 is formed through the two flat surfaces 122. To be more precise, the two limit recesses 124 are recessed from the outer lateral surface 123, and each one of the limit recesses 124 has an entrance part 1242 and an installing part 1241. A width of the entrance part 1242 is less than a width of the installing part 1241, and the two limit spaces 121 are respectively located in the installing parts 1241 of the two limit recesses 124.

In addition, the limit space 121 forms an opening on the flat surface 122 facing to the first connecting unit 11, and the installation hole 111 also forms an opening on the bottom surface 1102; the opening on the flat surface 122 facing to the first connecting unit 11 is smaller than the opening on the bottom surface 1102, and thereby when the second connecting unit 12 is connected to the first connecting unit 11, part of the second connecting unit 12 would protrude inward from an edge part of the opening on the bottom surface 1102; in other words, the edge part of the opening on the bottom surface 1102 would be covered by the second connecting unit 12.

With reference to FIGS. 3 to 6, each one of the probe assemblies 20 includes a main sleeve 21, a probe module 22, a buffering module 23, and a connecting sleeve 24.

The main sleeve 21 of each one of the probe assemblies 20 is detachably mounted through the installation hole 111 of the first connecting unit 11 and the limit space 121 of the second connecting unit 12. In other words, the main sleeve 21 is disposed through the installation hole 111 and the limit recess 124. Besides, an outer diameter of the main sleeve 21 is no more than a width of the entrance part 1242 of the limit recess 124, and thus the main sleeve 21 is capable of entering or exiting the limit space 121 in the installing part 1241 via the entrance part 1242.

The main sleeve 21 has a channel 211, an abutting part 212, two engaging recesses 213, two engaging units 214, and a sign 215. In this embodiment, the main sleeve 21 is a cylinder, and the channel 211 is formed in the main sleeve 21. The channel 211 is formed along a length direction of the main sleeve 21 and through two opposite ends of the main sleeve 21, but it is not limited thereto. The main sleeve 21 may be altered in shape as desired. The abutting part 212 is mounted on an outer annular surface of the main sleeve 21, and the abutting part 212 has an abutting surface 2121 facing to the connecting assembly 10. In this embodiment, the abutting part 212 is an annular protrusion that protrudes from the outer annular surface of the main sleeve 21 and surrounds the main sleeve 21, but it is not limited thereto. The abutting part 212 may be altered in configuration as desired, such as multiple bumps formed on the outer annular surface of the main sleeve 21, as long as there is a surface facing the connecting assembly 10.

The two engaging recesses 213 are recessed from the outer annular surface of the main sleeve 21, and the two engaging units 214 are respectively engaged in the two engaging recesses 213. Each one of the engaging units 214 is a thin slice which fits with a bottom plane of the corresponding engaging recess 213 and protrudes from the outer annular surface of the main sleeve 21. In this embodiment, the two engaging recesses 213 are located at two opposite sides of the main sleeve 21 along a radial direction. Each one of the engaging recesses 213 is rectangular in shape, and each one of the engaging units 214 is round, but it is not limited thereto. The positions of the engaging recesses 213 and the shapes of the engaging recesses 213 and the engaging units 214 may be altered as desired.

Furthermore, the main sleeve 21 has the sign 215 which is disposed on the outer annular surface of the main sleeve 21. In this embodiment, the sign 215 surrounds the main sleeve 21 along a circumferential direction of the main sleeve, but it is not limited thereto.

The probe module 22 is cylindrical in shape and is mounted through the channel 211 of the main sleeve 21. Two contacting parts 221 are mounted on two opposite ends of the probe module 22, and thus the probe module 22 is capable of electrically connecting with other devices. Besides, the contacting part 221 may be altered in configuration according to the device connected with.

The buffering module 23 is mounted on the main sleeve 21, and the buffering module 23 is capable of compressing and stretching along the length direction of the main sleeve 21. The buffering module 23 has two opposite end portions, one of the end portions abuts the abutting surface 2121 of the abutting part 212, and another one of the end portions abuts the connecting assembly 10. In this embodiment, the buffering module 23 includes an elastic unit 231 and a pressing ring 232. The elastic unit 231 is sleeved on the main sleeve 21, an end of the elastic unit 231 abuts the abutting surface 2121, and the pressing ring 232 is mounted at another end of the elastic unit 231. The pressing ring 232 detachably abuts the flat surface 122 which faces to the elastic unit 231.

The elastic unit 231 in this embodiment is a compression spring, and the pressing ring 232 has an outer ring part 2321 and an inner ring part 2322. The inner ring part 2322 and the outer ring part 2321 are cylindrical in shape. The outer ring part 2321 has two opposite end surfaces, one of the end surfaces abuts the elastic unit 231 and another one of the end surfaces abuts the flat surface 122 facing to the elastic unit 231. The inner ring part 2322 is connected to one of the end surfaces of the outer ring part 2321, and said end surface faces to the second connecting unit 12. When the outer ring part 2321 abuts the second connecting unit 12, the inner ring part 2322 is located in the installing part 1241 of the limit recess 124. Furthermore, an outer diameter of the inner ring part 2322 is larger than the width of the entrance part 1242, thereby preventing the pressing ring 232 from leaving the installing part 1241 via the entrance part 1242.

The connecting sleeve 24 is sleeved on one of the ends of the main sleeve 21 and mounted through the installation hole 111 of the first connecting unit 11. The connecting sleeve 24 abuts the flat surface 122 which faces to the first connecting unit 11, and thereby the connecting sleeve 24 and the pressing ring 232 are capable of together clamping the second connecting unit 12, such that the probe assembly 20 is fixed with respect to the second connecting unit 12. To be more precise, when the second connecting unit 12 is connected to the first connecting unit 11, part of the second connecting unit 12 protrudes inward along the radial direction of the opening which is formed by the installation hole 111 on the bottom surface 1102, and an end of the connecting sleeve 24 abuts said part of the second connecting unit 12. In addition, in this embodiment, the connecting sleeve 24 and the installation hole 111 are rectangular in shape, thereby preventing the connecting sleeve 24 from rotating with respect to the installation hole 111, but it is not limited thereto.

The connecting sleeve 24 has a first slot 241, a second slot 242, a fixing hole 243, a fixing unit 244, a spacer 245, and two engaging holes 246. The first slot 241 and the second slot 242 are formed on two opposite ends of the connecting sleeve 24. The main sleeve 21 is inserted into the first slot 241, and the probe module 22 protrudes from a bottom surface of the second slot 242.

The fixing hole 243 is formed through a lateral wall 240 of the connecting sleeve 24 and spatially communicates with the second slot 242. The fixing unit 244 is movably mounted through the fixing hole 243. The fixing unit has a penetrating part 2441 and a squeezing part 2442. The squeezing part 2442 is connected to the penetrating part 2441, and an outer diameter of the squeezing part 2442 is larger than an inner diameter of the fixing hole 243. The penetrating part 2441 is movably mounted through the fixing hole 243, and the squeezing part 2442 is located outside of the second slot 242. The spacer 245 is squeezed between the squeezing part 2442 and the lateral wall 240 of the connecting sleeve 24. In this embodiment, the fixing unit 244 is a screw and the spacer 245 is a gasket, and thus the fixing unit 244 is mounted through the spacer 245, but it is not limited thereto.

The two engaging holes 246 are formed through the lateral wall 240 of the connecting sleeve 24 and spatially communicate with the first slot 241. Furthermore, the two engaging holes 246 respectively spatially communicate with the two engaging recesses 213 of the main sleeve 21, and the engaging units 214 respectively engage in the engaging holes 246. To be more precise, the engaging hole 246 and the engaging recess 213 are the same in shape. A part of each one of the engaging units 214 protruding from the outer annular surface of the main sleeve 21 engages with the corresponding engaging hole 246, and thereby the connecting sleeve 24 is fixed on the main sleeve 21 and would not rotate with respect to the main sleeve 21.

Figure 9:
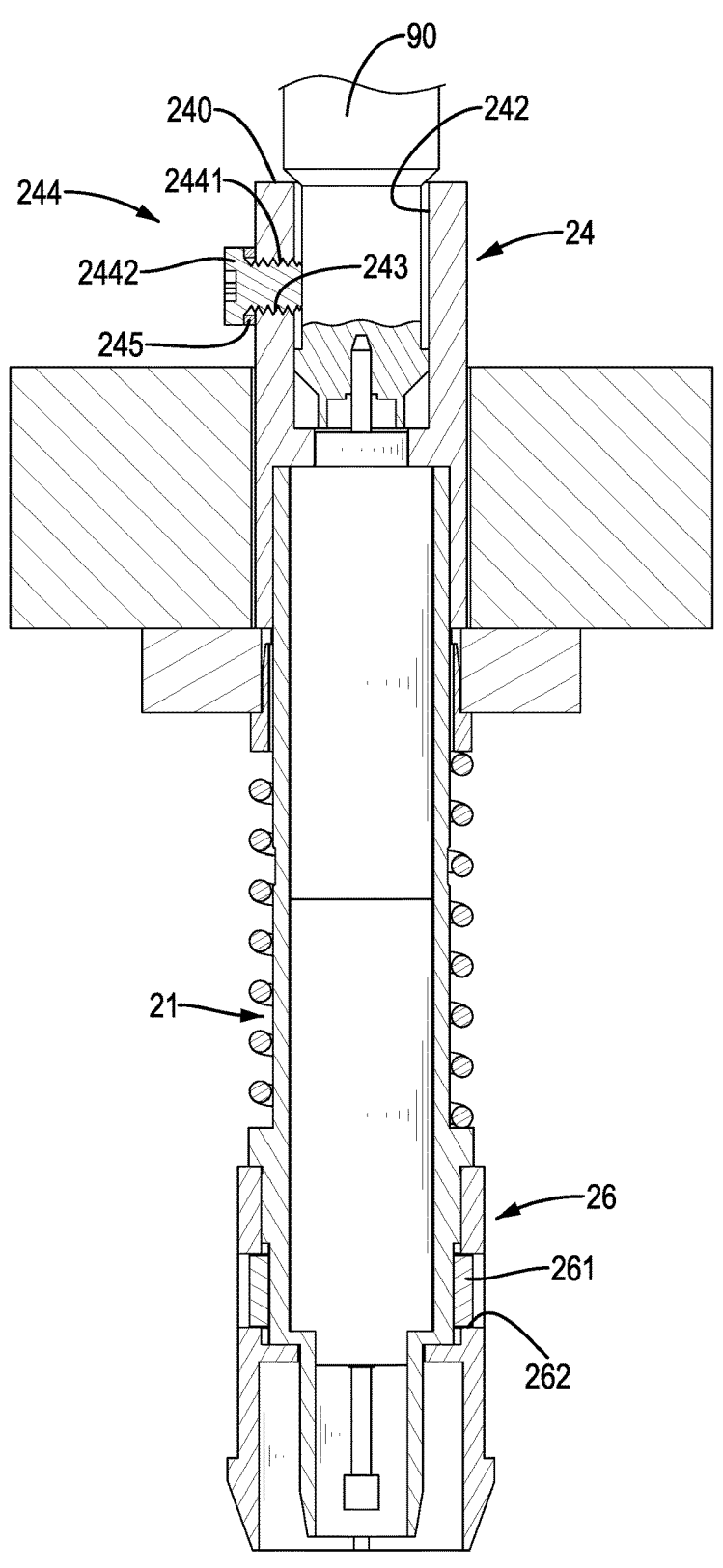
FIG. 9 is a lateral cross-sectional view of the test terminal in FIG. 1, viewed from another angle from FIG. 6 and showing the test terminal connected to a connecting head.

Moreover, the probe assembly 20 may further include an end sleeve 26 which is configured to connect with a product to be tested. The end sleeve 26 is mounted on another one of the ends of the main sleeve 21, and said another one of the ends is opposite to the end connected to the connecting sleeve 24. Besides, as shown in FIG. 9, in this embodiment, just like the means of fixing the connecting sleeve 24 on the main sleeve 21, the end sleeve 26 also has two engaging pieces 261 to engage in the lateral perforation holes 262 and the main sleeve 21, and thus the end sleeve 26 is fixed on the main sleeve 21, but it is not limited thereto. The method to fix the end sleeve 26 on the main sleeve 21 may be altered as desired, or the test terminal may not have the end sleeve 26.

Figure 7:
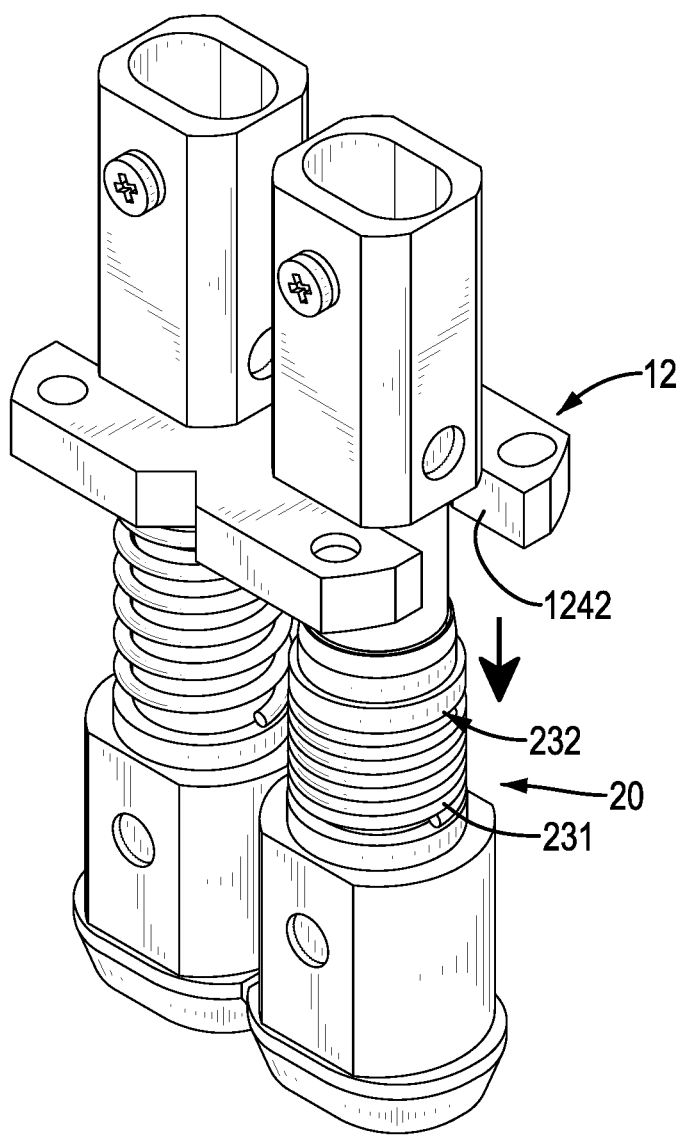
FIGS. 7 and 8 are perspective views of the test terminal in FIG. 1, showing serial operational movements of removing the probe assembly from the test terminal.
Figure 8:
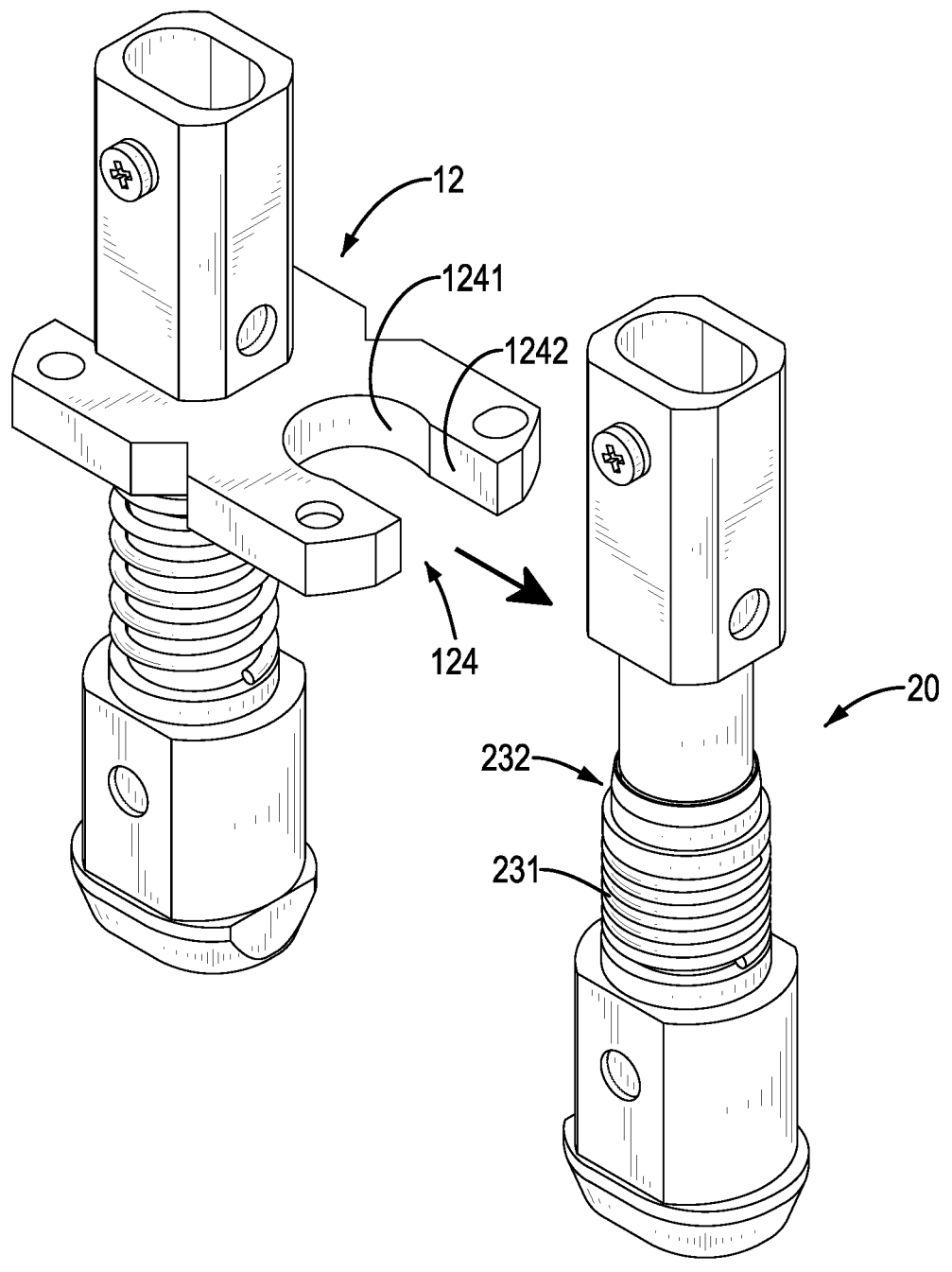

With reference to FIGS. 3, 7, and 8, to remove the probe assembly 20 from the connecting assembly 10, first separate the second connecting unit 12 from the first connecting unit 11, then move the pressing ring 232 to compress the elastic unit 231, and finally move the probe assembly 20 out of the limit recess 124 via the entrance part 1242. On the other hand, to install the probe assembly 20, first move the pressing ring 232 to compress the elastic unit 231, and then place the probe assembly 20 into the installing part 1241 of the limit recess 124 via the entrance part 1242. Finally, restore the elastic unit 231 and the pressing ring 232, and reconnect the first connecting unit 11 and the second connecting unit 12 as shown in FIG. 2 to complete the installation.

With reference to FIG. 9, a connecting head 90 of a circuit test machine is inserted into the second slot 242 of the connecting sleeve 24, and the fixing unit 244 is mounted in the fixing hole 243. The penetrating part 2441 of the fixing unit 244 abuts the connecting head 90, and the spacer 245 is squeezed between the fixing unit 244 and the lateral wall 240 of the connecting sleeve 24. The spacer 245 limits a depth that the fixing unit 244 is inserted, and thus prevents the connecting head 90 from damage by the fixing unit 244 inserted too deep. In other words, the spacer 245 provides a base for the fixing unit 244 to mount on, and thereby the connecting head 90 is well-fixed, free from susceptibility to damage. The user may not be able to insert the fixing unit 244 deep enough with concerns of damaging the connecting head 90, such that the connecting head 90 may be separated from the connecting sleeve 24.

Figure 10:
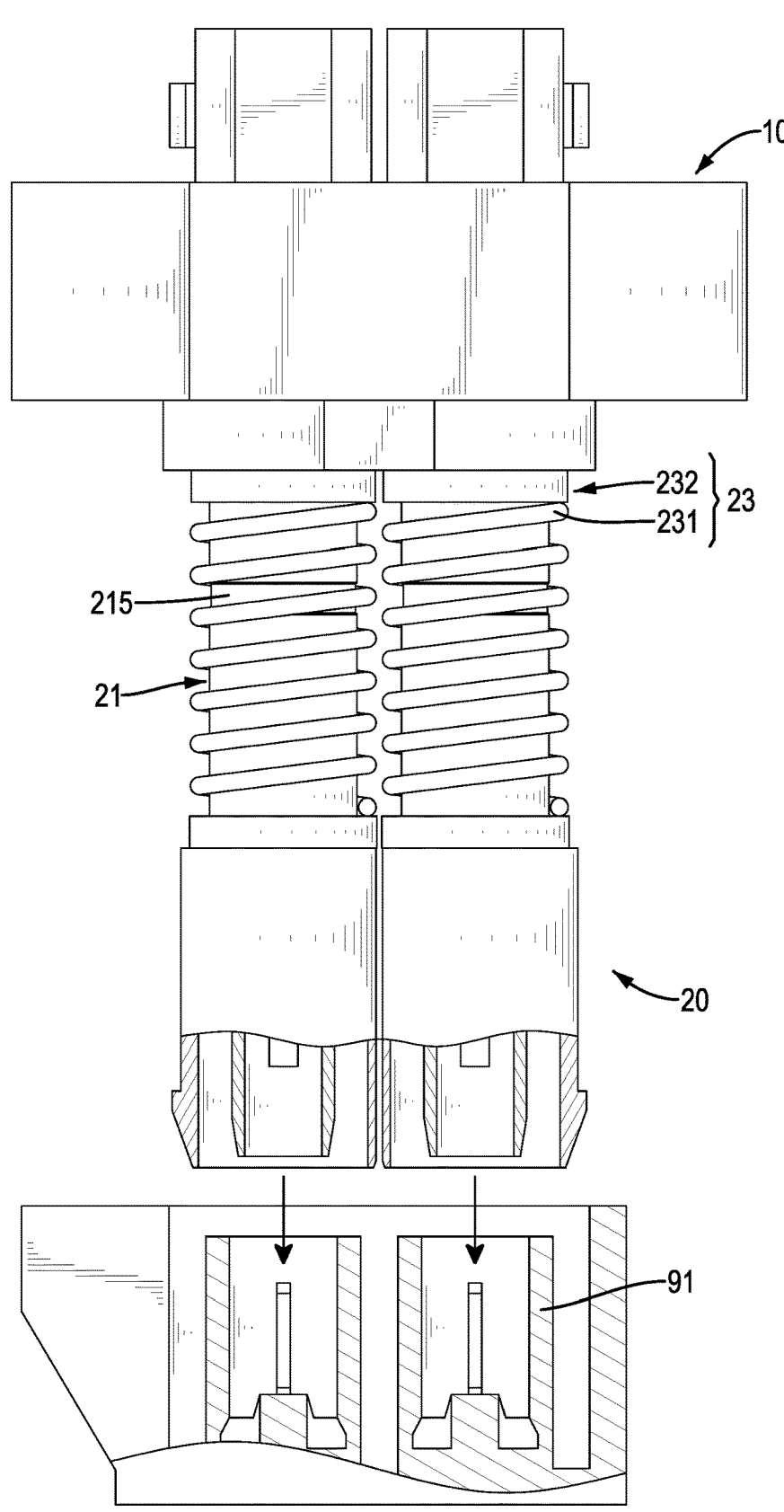
FIGS. 10 and 11 show serial operational movements of inserting the test terminal in FIG. 1 into a connecting port of a product.
Figure 11:
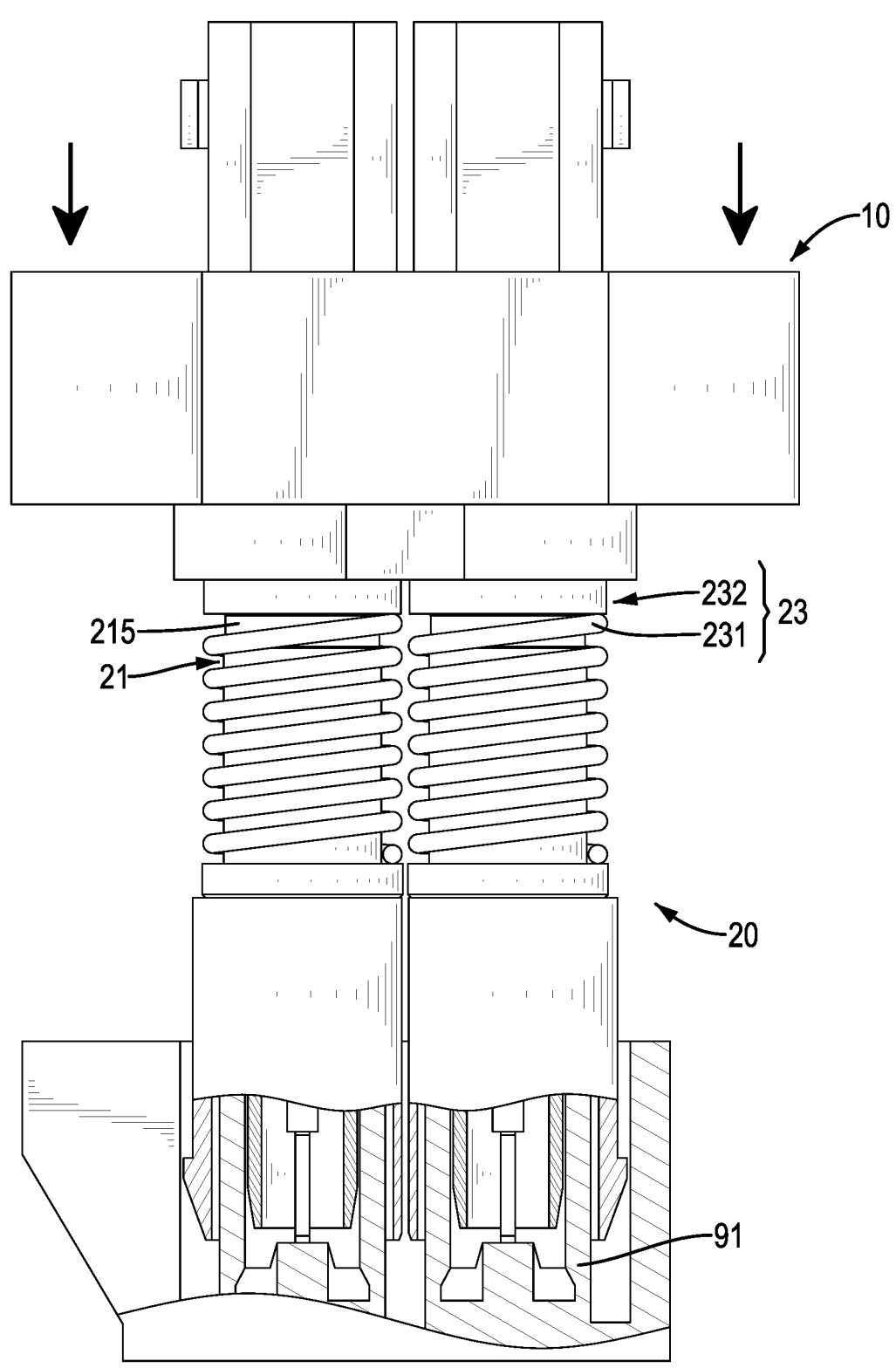

FIGS. 10 and 11 are serial operational movements of inserting the test terminal into a connecting port of a product. The circuit test machine would keep pressing after the probe assembly 20 contacts the connecting port 91, and thus the connecting assembly 10 would compress the elastic unit 231 to ensure the test terminal contacts the connecting port 91 of the product. Furthermore, since the sign 215 mounted on the main sleeve 21 marks degrees of deformation of the buffering module 23, the user is able to visually and directly check whether the pressing travel is proper or not, to prevent the product being damaged by over-pressing or system errors resulting from unstable connection.

Figure 12:
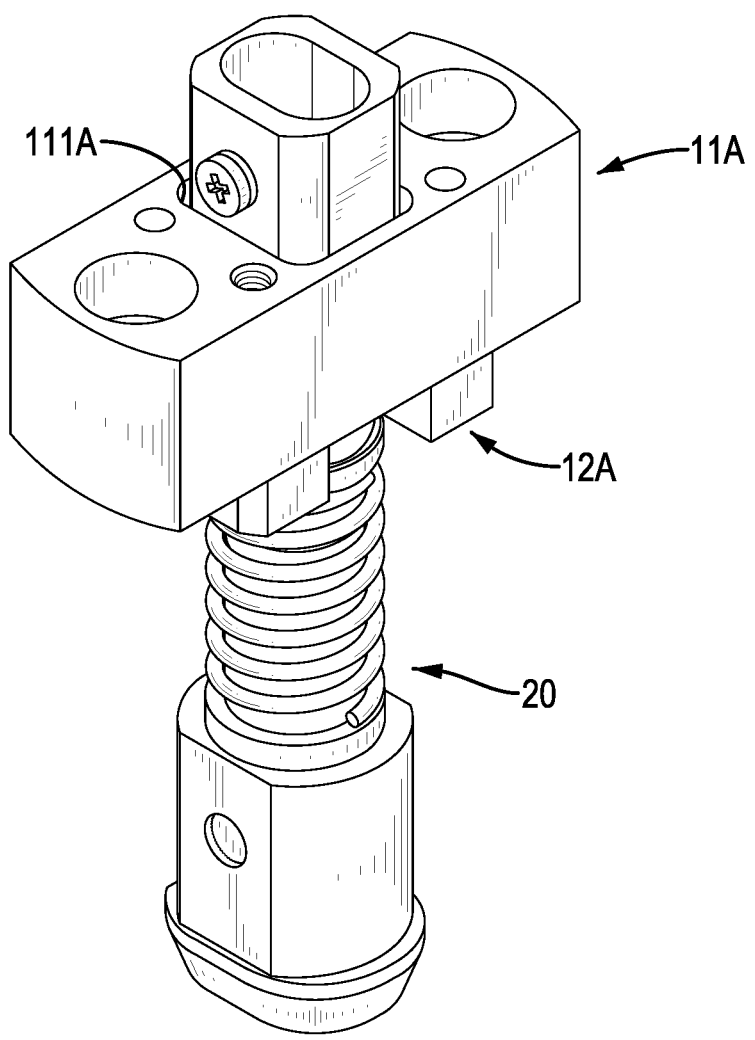
FIG. 12 is a perspective view of a second embodiment of a test terminal in accordance with the present invention.
Figure 13:
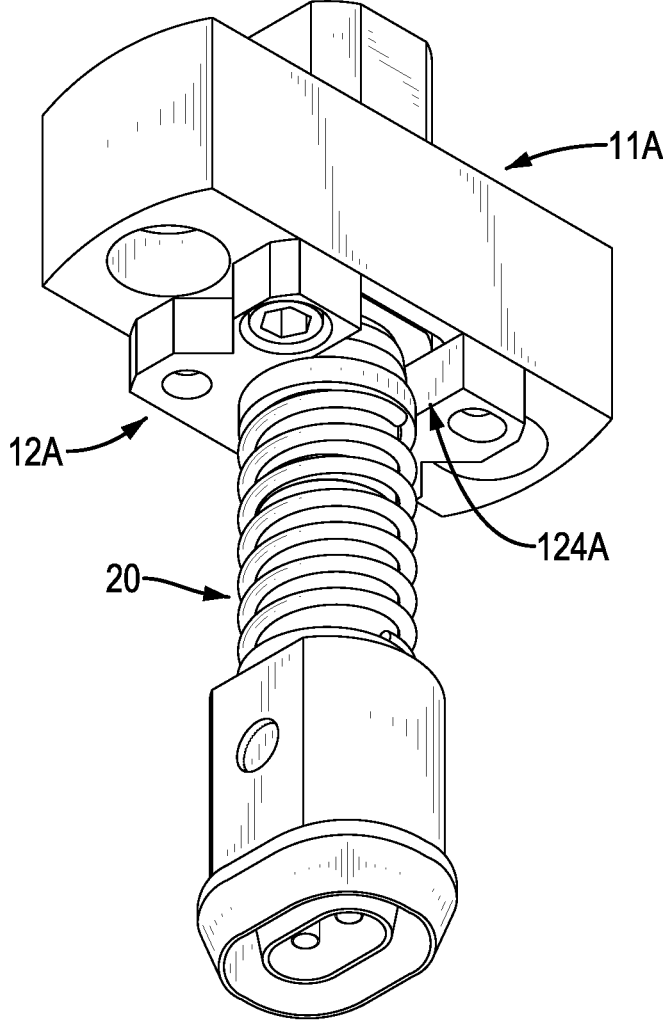
FIG. 13 shows the test terminal of FIG. 12 viewed from another angle.

FIGS. 12 and 13 show a second embodiment of the test terminal, which is similar to the first embodiment. The main difference between the second embodiment and the first embodiment is the number of the probe assemblies 20. In this embodiment, the test terminal has one probe assembly 20. The first connecting unit 11A has one said installation hole 111A and the second connecting unit 12A has one said limit recess 124A, but it is not limited thereto. Numbers of the installation hole 111A and the limit recess 124A may differ from the number of the probe assembly 20.

Figure 14:
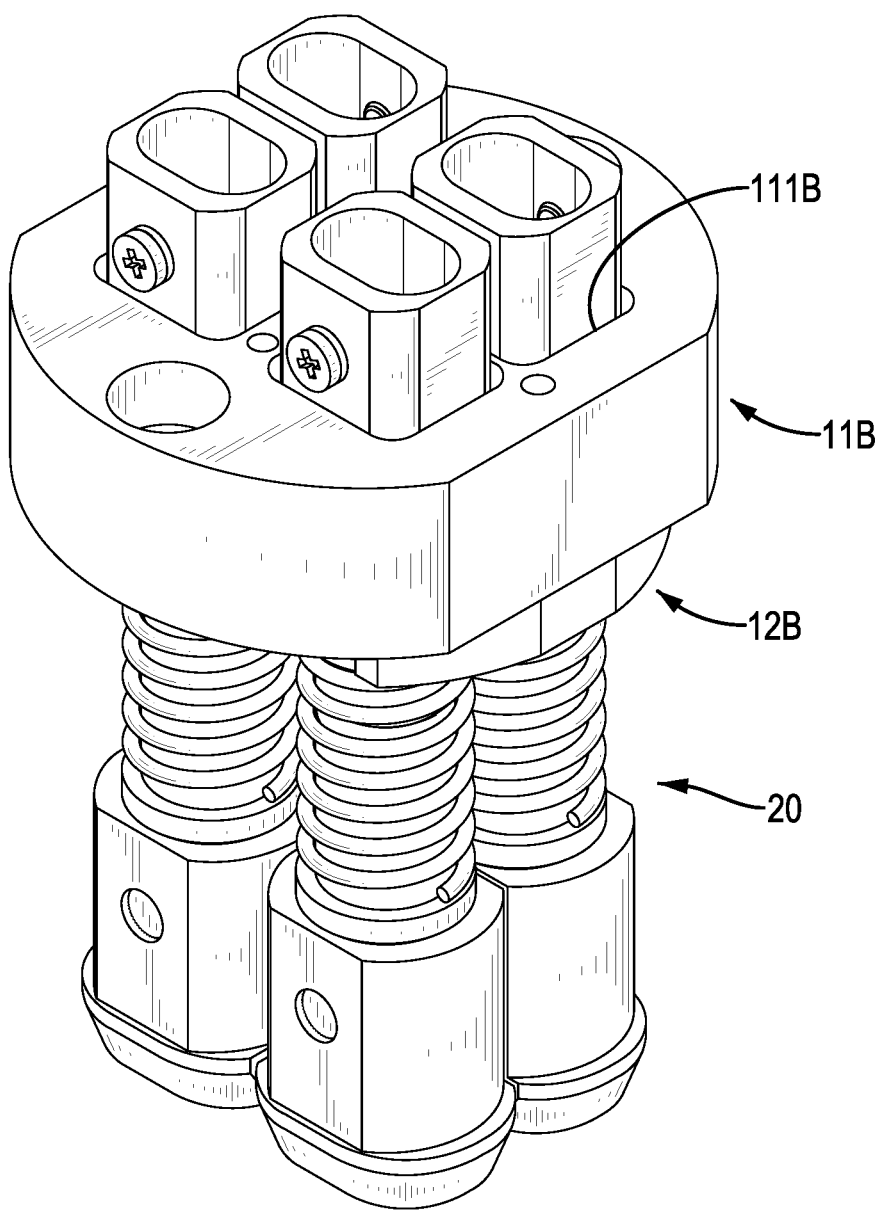
FIG. 14 is a perspective view of a third embodiment of a test terminal in accordance with the present invention.
Figure 15:
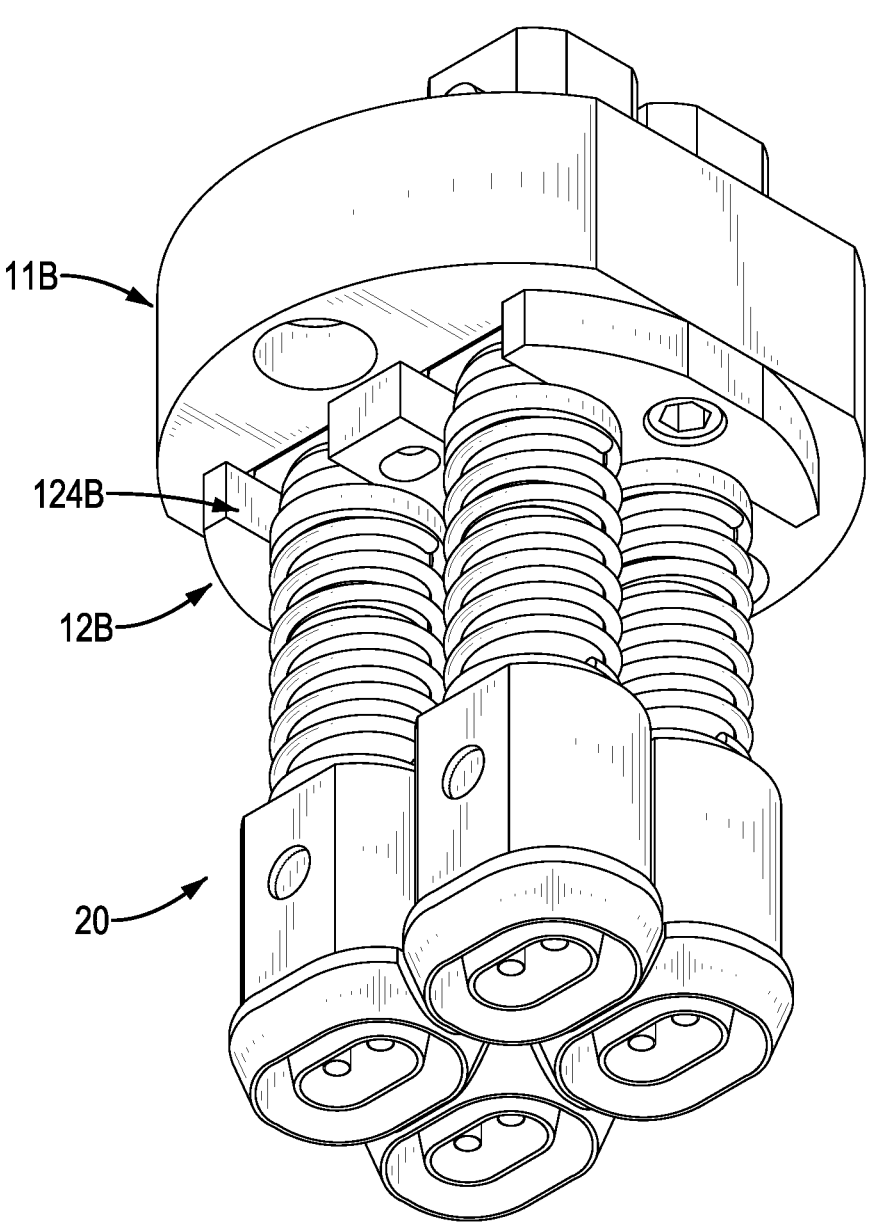
FIG. 15 shows the test terminal of FIG. 14 viewed from another angle.

FIGS. 14 and 15 show a third embodiment of the test terminal, which is similar to the first embodiment. The main difference between the third embodiment and the first embodiment is the number of the probe assemblies 20. In this embodiment, the test terminal has four probe assemblies 20. The first connecting unit 11B has four of the installation holes 111B and the second connecting unit 12B has four of the limit recesses 124B, but it is not limited thereto. Numbers of the installation hole 111B and the limit recess 124B may differ from the number of the probe assembly 20.

Figure 16:
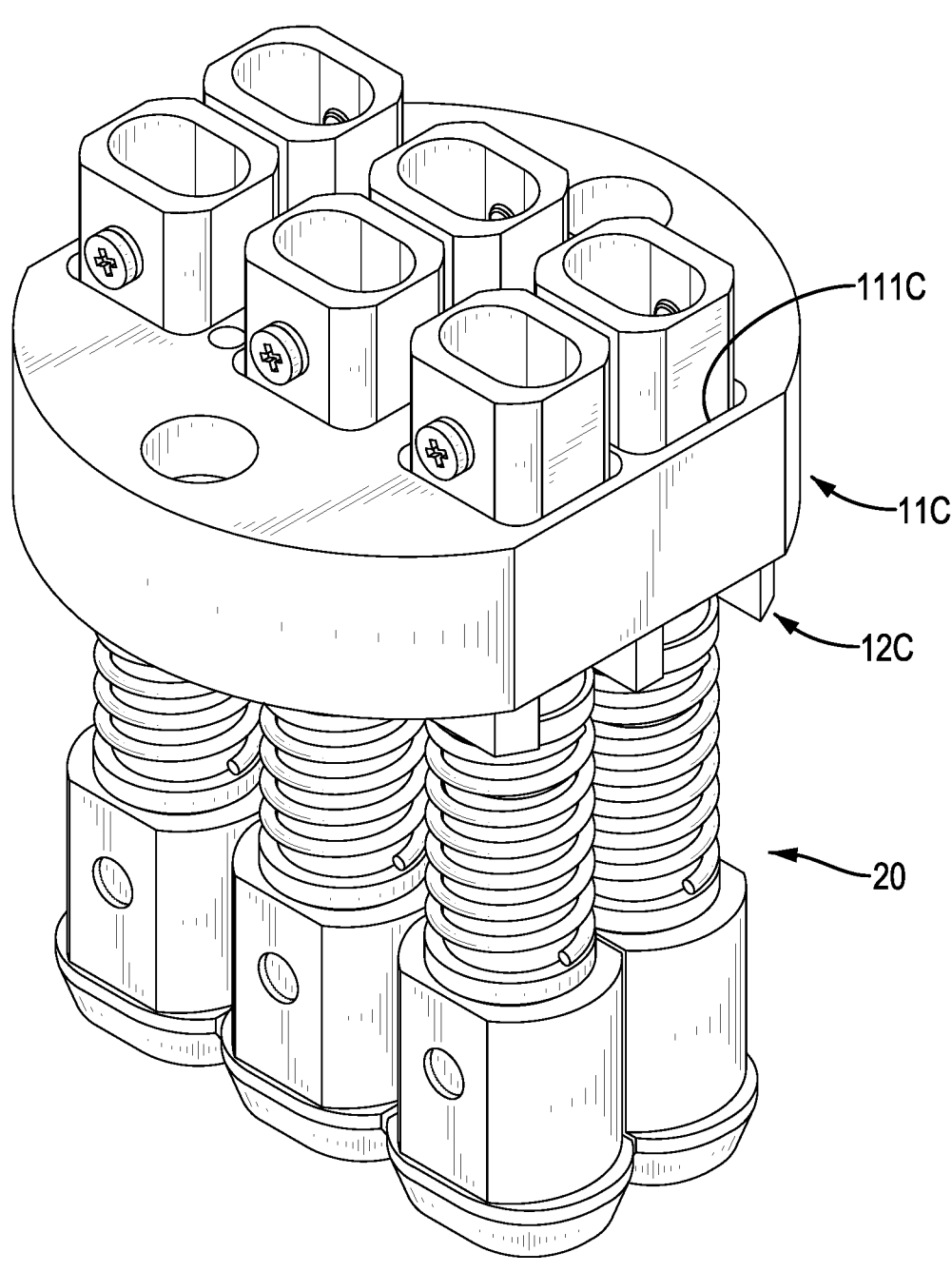
FIG. 16 is a perspective view of a fourth embodiment of a test terminal in accordance with the present invention.
Figure 17:
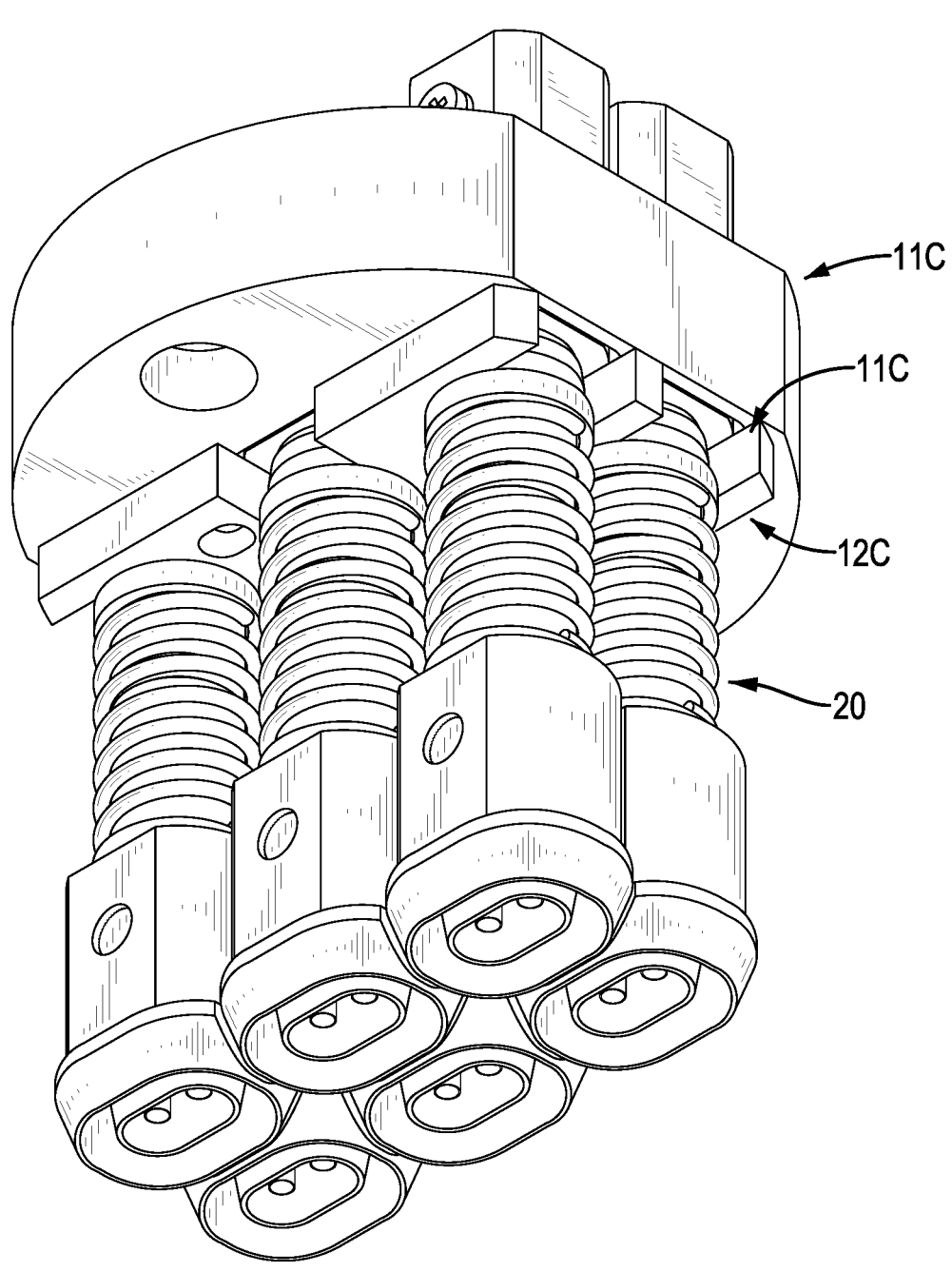
FIG. 17 shows the test terminal of FIG. 16 viewed from another angle.
Figure 18:
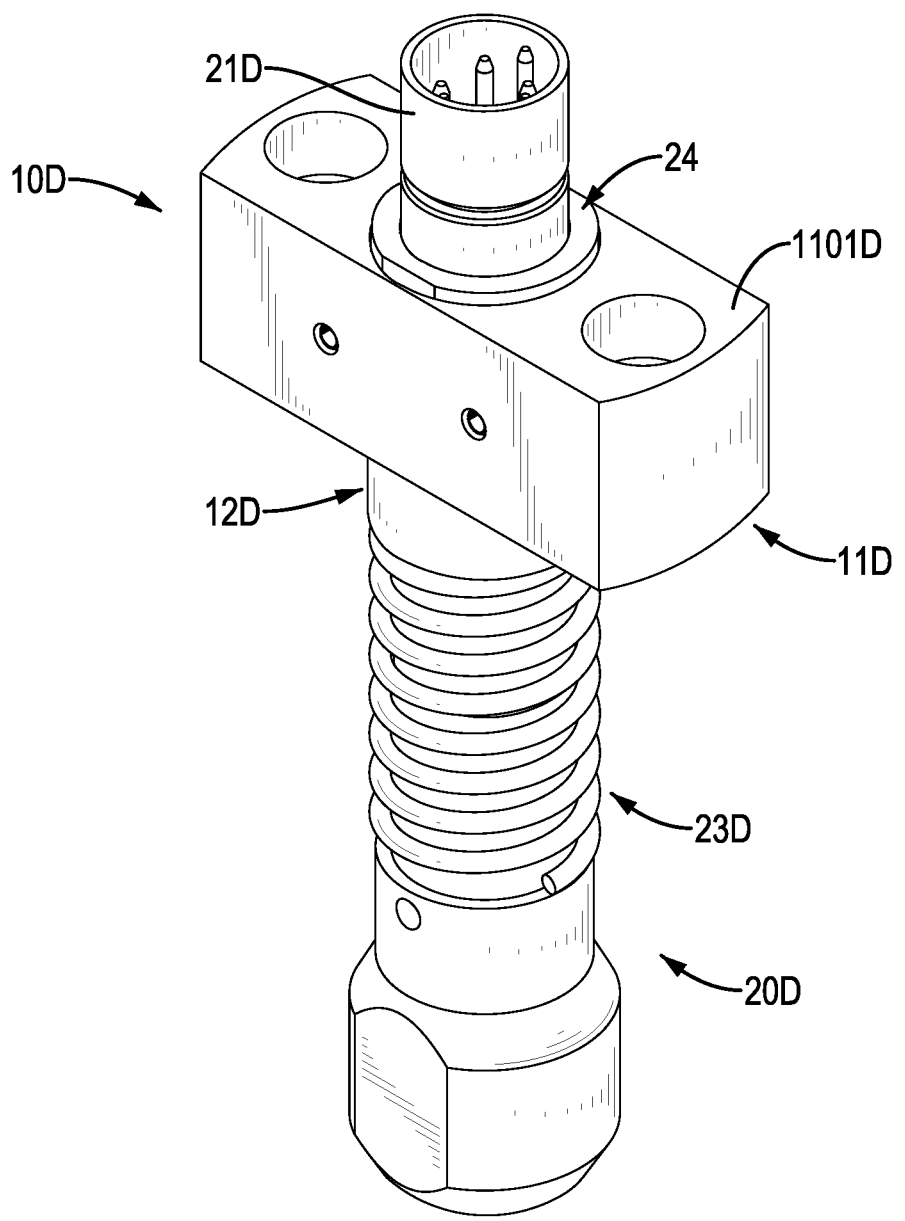
FIG. 18 is a perspective view of a fifth embodiment of a test terminal in accordance with the present invention.
Figure 19:
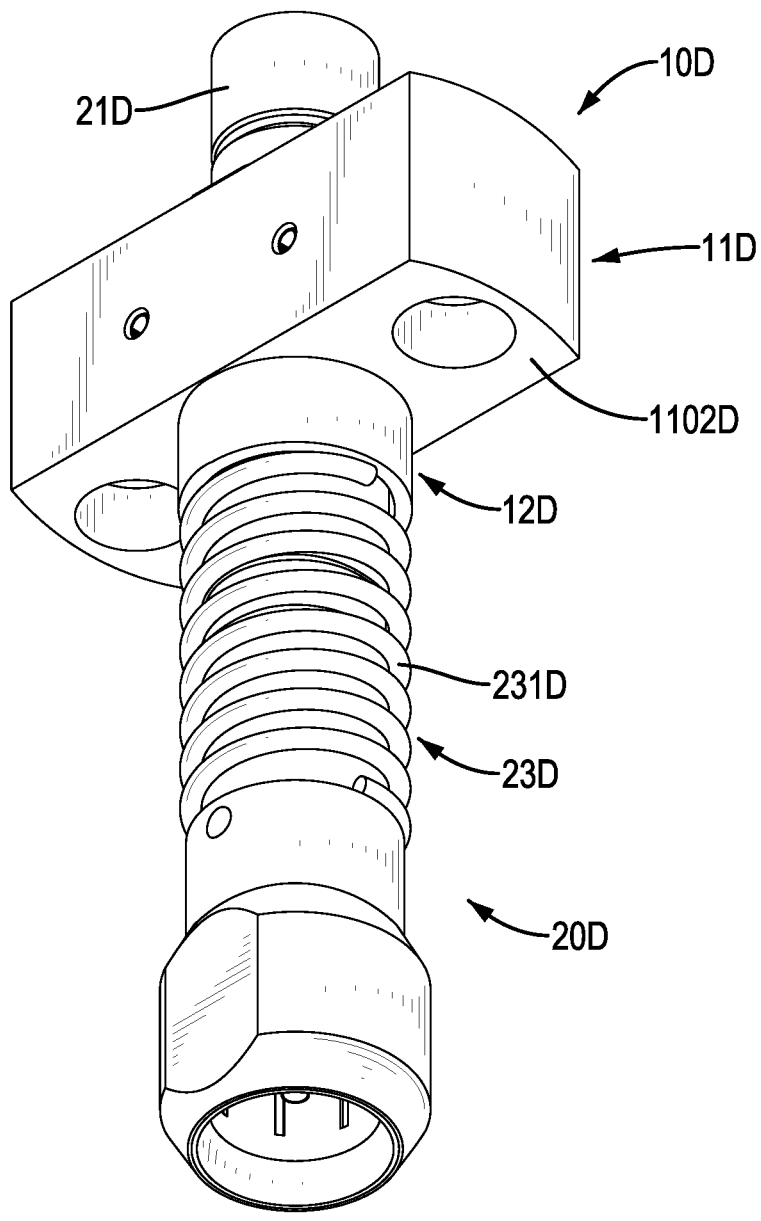
FIG. 19 shows the test terminal of FIG. 18 viewed from another angle.
Figure 20:
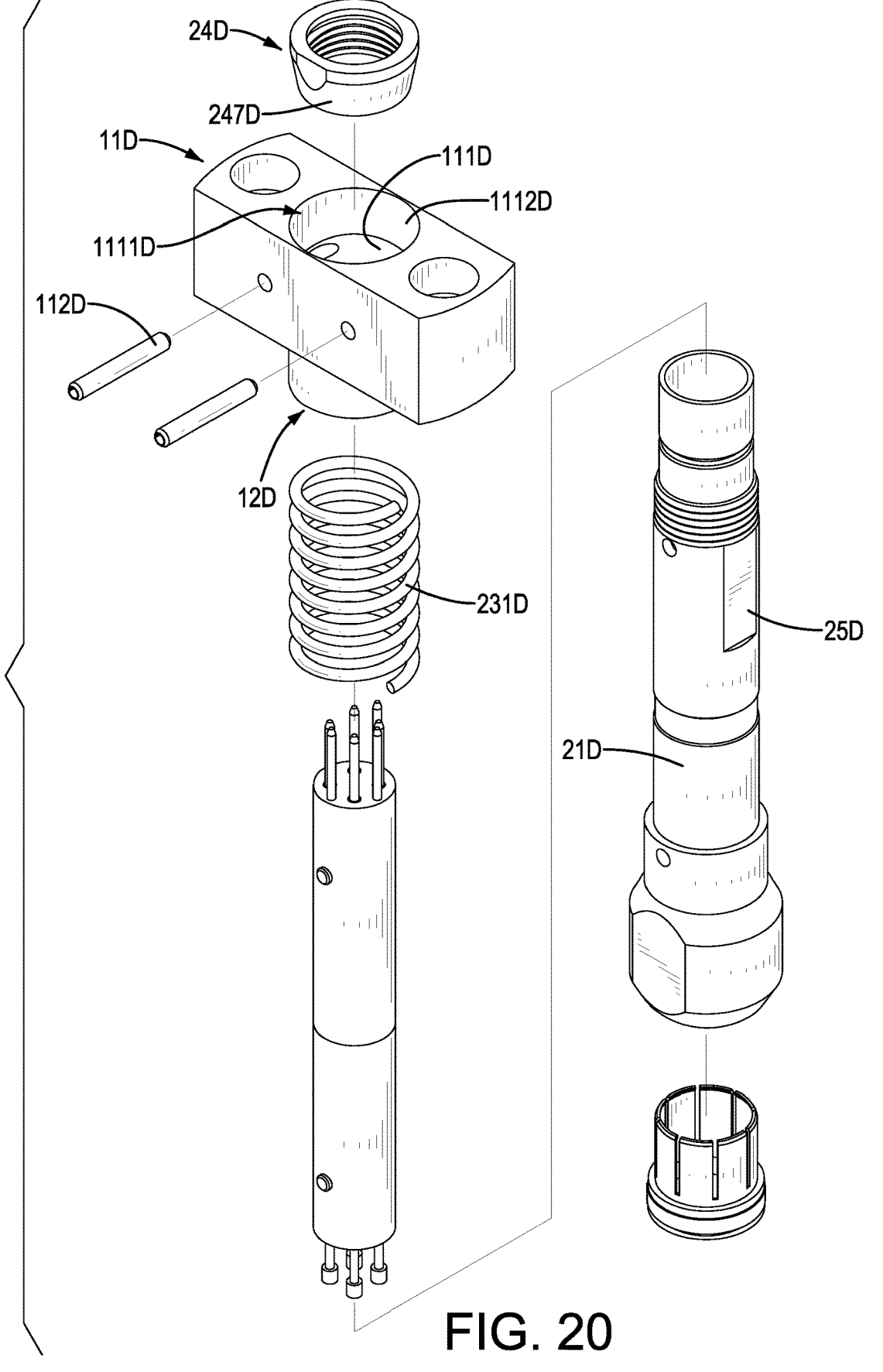
FIG. 20 is an exploded view of the test terminal in FIG. 19.

FIGS. 16 and 17 show a fourth embodiment of the test terminal, which is similar to the first embodiment. The main difference between the fourth embodiment and the first embodiment is the number of the probe assemblies 20. In this embodiment, the test terminal has six probe assemblies 20. The first connecting unit 11C has six installation holes 111C and the second connecting unit 12C has six limit recesses 124C, but it is not limited thereto. Numbers of the installation hole 111C and the limit recess 124C may differ from the number of the probe assembly 20.

With reference to FIGS. 18 to 22, a fifth embodiment of the test terminal has a first connecting unit 11D and a second connecting unit 12D integrally formed together, and the main sleeve 21D detachably mounted through the first connecting unit 11D and the second connecting unit 12D. A limit space 121D is formed through the second connecting unit 12D and spatially communicates with an installation hole 111D. A probe assembly 20D is mounted through the limit space 121D and the installation hole 111D. A connecting sleeve 24D detachably engages in the installation hole 111D of the first connecting unit 11D. In this embodiment, the buffering module 23D does not have a pressing ring, and an elastic unit 231D directly abuts the second connecting unit 12D.

To be more precise, the installation hole 111D includes an expanding section 1111D. An inner diameter of the expanding section 1111D is enlarged from the bottom surface 1102D to the top surface 1101D, and thus an inner annular surface 1112D of the expanding section 1111D is inclined with respect to the main sleeve 21D. To be more precise, the inner annular surface 1112D is inclined outward from the bottom surface 1102D to the top surface 1101D.

The connecting sleeve 24D is mounted on and surrounds the main sleeve 21D. The connecting sleeve 24D has an outer annular surface 247D which is inclined with respect to the main sleeve 21D, and thereby the outer annular surface 247D of the connecting sleeve 24D and the inner annular surface 1112D of the installation hole 111D of the expanding section 1111D fit with and detachably contact each other. The connecting sleeve 24D from inside and the elastic unit 231D from outside of the connecting assembly 10D together clamp the connecting assembly 10D, and thus the probe assembly 20D is fixed on the connecting assembly 10D.

In addition, in this embodiment, the main sleeve 21D of the probe assembly 20D further has two limit grooves 25D. Each one of the limit grooves 25D is recessed from an outer annular surface of the main sleeve 21D, and the limit grooves 25D are located in the installation hole 111D of the first connecting unit 11D. To be more precise, the two limit grooves 25D are respectively located at two opposite sides of the main sleeve 21D along a radial direction. Each one of the limit grooves 25D is flat-bottomed. The connecting assembly 10D further has two pins 112D mounted through the first connecting unit 11D. Each one of the pins 112D is mounted through the installation hole 111D and one of the limit grooves 25D, thereby preventing the probe assembly 20D rotating with respect to the first connecting unit 11D.

Figure 21:
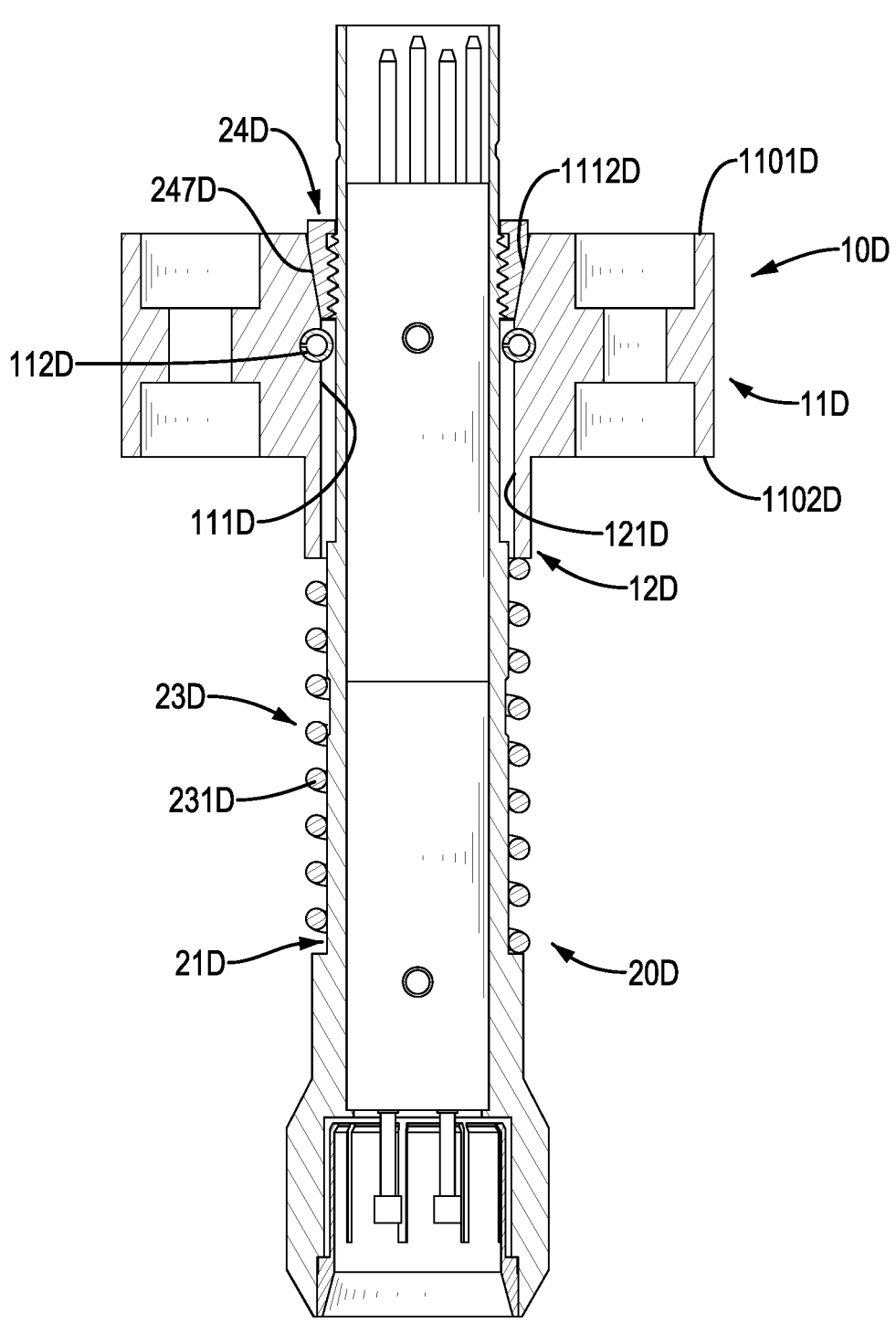
FIG. 21 is a lateral cross-sectional view of the test terminal in FIG. 18.
Figure 22:
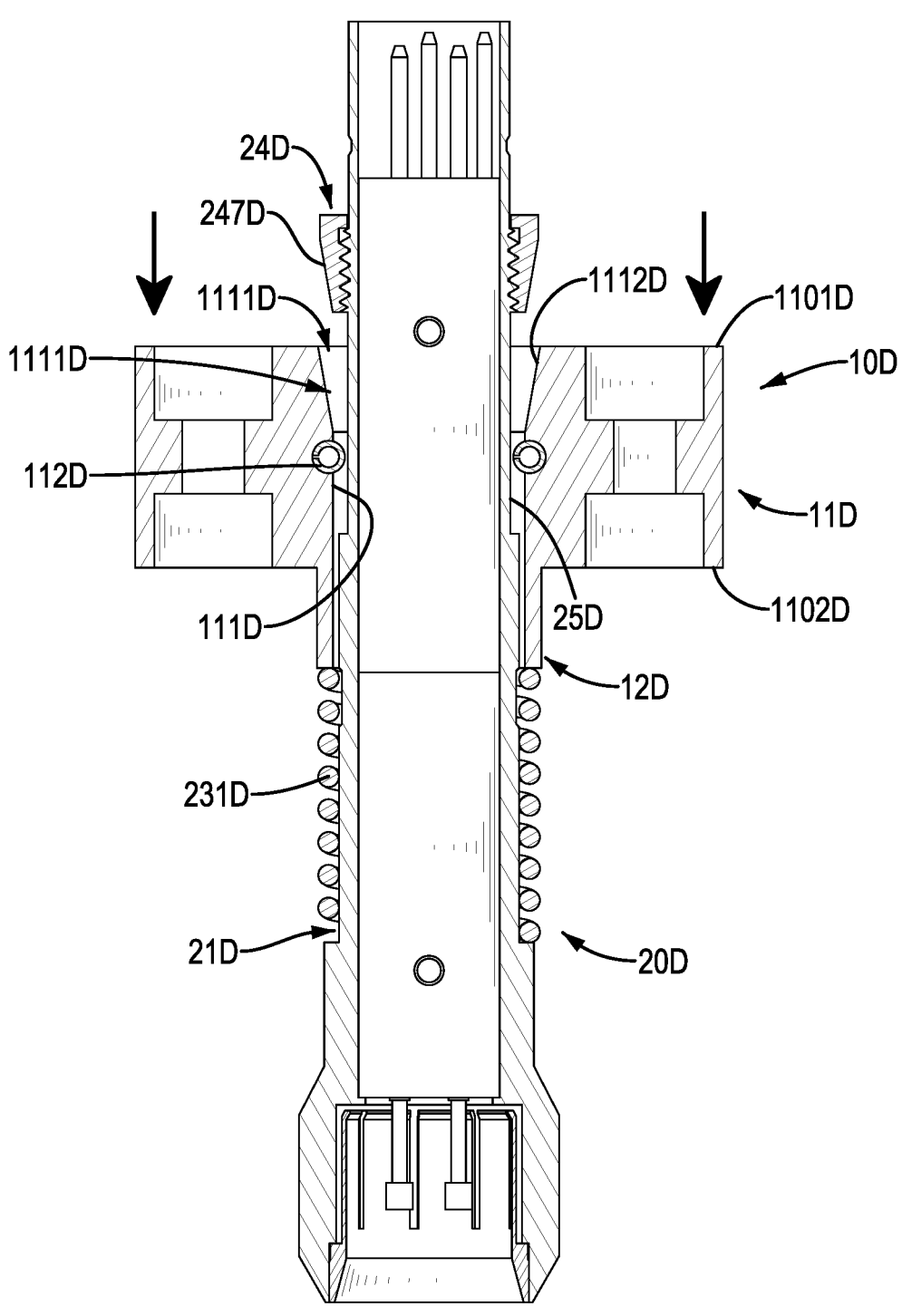
FIGS. 22 and 23 are lateral cross-sectional views of the test terminal in FIG. 18, showing serial operational movements of removing the probe assembly from the test terminal.
Figure 23:
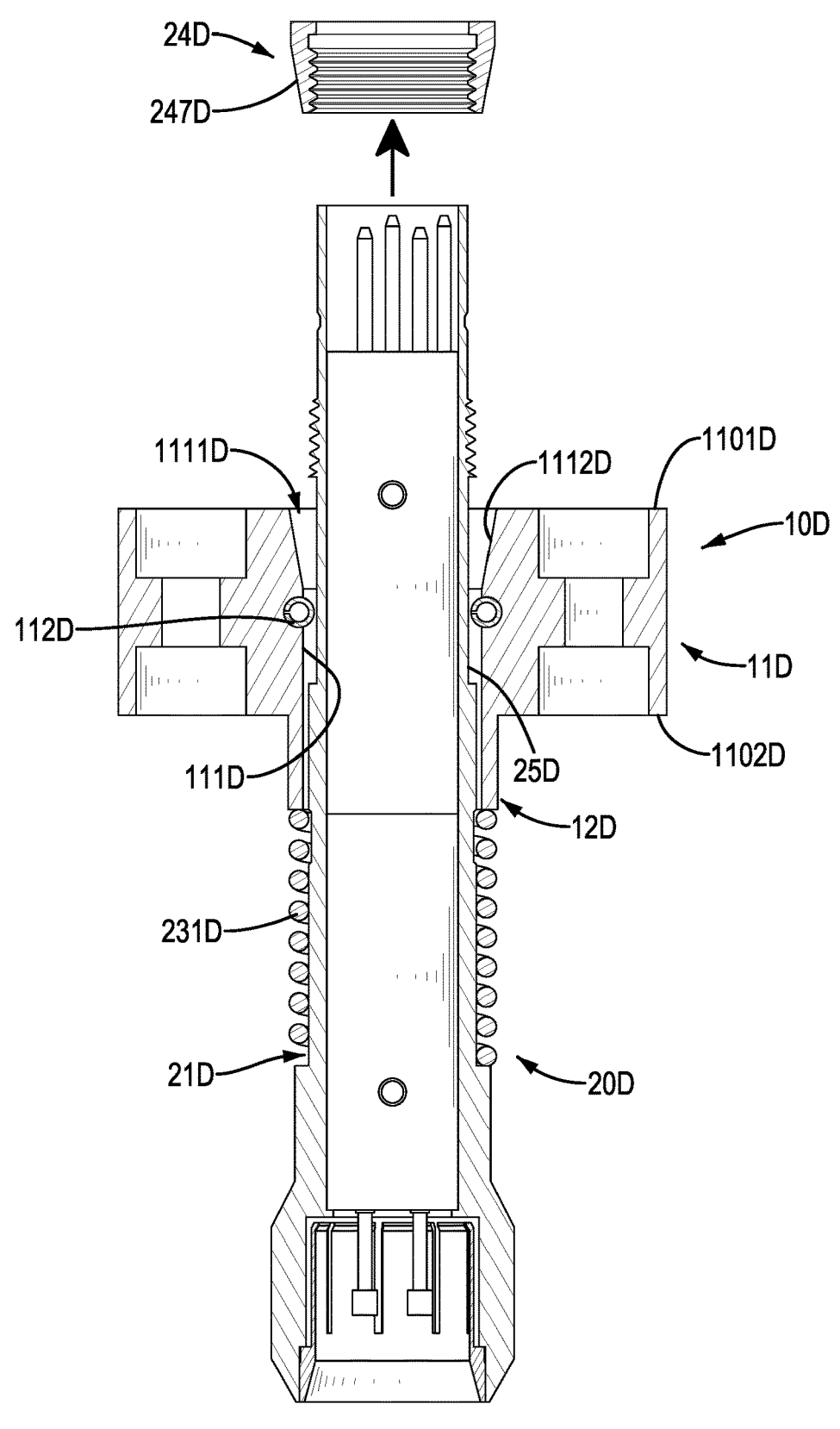

FIGS. 21 to 23 are serial operational movements of removing the probe assembly 20D from the test terminal in this embodiment. First move the connecting assembly 10D and compress the elastic unit 231D till the connecting sleeve 24D is completely out of the installation hole 111D, and then separate the connecting sleeve 24D from the main sleeve 21D. Finally, take out the probe assembly 20D from the installation hole 111D to complete separation of the probe assembly 20D from the first connecting unit 11D.

In another embodiment, the first connecting unit 11D may have multiple installation holes 111D, and multiple probe assemblies 20D are respectively installed in the installation holes 111D. Each one of the probe assemblies 20D can be installed or removed via the steps shown in FIGS. 21 to 23. Therefore, if one of the probe assemblies 20D is broken, the user can only replace the broken probe assembly 20D instead of the whole test terminal.

In summary, with the connecting sleeve 24 and the buffering module 23 together clamping the connecting assembly 10 to fix the probe assembly 20, the probe assembly 20 is capable of being removed from or installed on the connecting assembly 10 easily, and the user is able to remove or install one single probe assembly 20 to the test terminal. When the test terminal has several probe assemblies 20 and some of the probe assemblies 20 are broken, the user may only replace the broken probe assemblies 20 instead of the whole test terminal, thus reducing the cost and the waste, and being environmentally friendly.

Moreover, the test terminal has the spacer 245 to help the fixing unit 244 fix the connecting head 90 of the circuit test machine, thus preventing the fixing unit 244 damaging the connecting head 90 or the connecting head 90 separating from the connecting sleeve 24. Furthermore, since the sign 215 mounted on the main sleeve 21 marks degrees of deformation of the buffering module 23, the user is able to visually and directly check whether the pressing travel is proper or not and adjusts instantly, to prevent the product being damaged by over-pressing or system errors resulting from unstable connection.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A test terminal comprising:
   a connecting assembly including:

a first connecting unit having a top surface and a bottom surface opposite to each other, and at least one installation hole formed through the top surface and the bottom surface;

a second connecting unit connected to the first connecting unit, and the second connecting unit having at least one limit space, the at least one limit space and the at least one installation hole fluidly communicating with each other;

at least one probe assembly each including:

a main sleeve detachably mounted through the at least one installation hole of the first connecting unit and the at least one limit space of the second connecting unit; the main sleeve having:

a channel formed along a length direction of the main sleeve and through two opposite ends of the main sleeve;

an abutting part mounted on an outer annular surface of the main sleeve, the abutting part having an abutting surface facing to the connecting assembly;

a connecting sleeve sleeved on the main sleeve and mounted through the installation hole of the first connecting unit;

a probe module mounted in the channel of the main sleeve; and a buffering module mounted on the main sleeve and capable of compressing and stretching along the length direction of the main sleeve, the buffering module having two opposite end portions, one of the end portions abutting the abutting surface of the abutting part, and another one of the end portions abutting the second connecting unit; and wherein, the second connecting unit is detachably clamped and fixed between the connecting sleeve and the buffering module.

2. The test terminal as claimed in claim 1, wherein:

the second connecting unit is a plate and has two opposite flat surfaces and an outer lateral surface; the outer lateral surface connects with the two flat surfaces; the at least one limit space is formed through the two flat surfaces, and one of the two flat surfaces is connected to the bottom surface of the first connecting unit; the second connecting unit further has:

at least one limit recess recessed from the outer lateral surface of the second connecting unit, and the at least one limit space located in the at least one limit recess.

3. The test terminal as claimed in claim 1, wherein the buffering module includes:

an elastic unit sleeved on the main sleeve; an end of the elastic unit abutting the abutting surface of the abutting part; and a pressing ring mounted at another end of the elastic unit, and the pressing ring abutting one of the two flat surfaces of the second connecting unit, said flat surface facing to the elastic unit.

4. The test terminal as claimed in claim 2, wherein the buffering module includes:

an elastic unit sleeved on the main sleeve; an end of the elastic unit abutting the abutting surface of the abutting part; and a pressing ring mounted at another end of the elastic unit, and the pressing ring abutting one of the two flat surfaces of the second connecting unit, said flat surface facing to the elastic unit.

5. The test terminal as claimed in claim 1, wherein, the connecting sleeve further includes:

a first slot and a second slot respectively formed on two opposite ends of the connecting sleeve; the main sleeve inserted into the first slot and the probe module protruding from a bottom surface of the second slot.

6. The test terminal as claimed in claim 4, wherein, the connecting sleeve further includes:

a first slot and a second slot respectively formed on two opposite ends of the connecting sleeve; the main sleeve inserted into the first slot and the probe module protruding from a bottom surface of the second slot.

7. The test terminal as claimed in claim 5, wherein, the connecting sleeve further includes:

a fixing hole formed through a lateral wall of the connecting sleeve and spatially communicating with the second slot;

a fixing unit having:

a penetrating part movably mounted through the fixing hole;

a squeezing part connected to the penetrating part, an outer diameter of the squeezing part larger than an inner diameter of the fixing hole; and a spacer squeezed between the squeezing part and the lateral wall of the connecting sleeve.

8. The test terminal as claimed in claim 6, wherein, the connecting sleeve further includes:

a fixing hole formed through a lateral wall of the connecting sleeve and spatially communicating with the second slot;

a fixing unit having:

a penetrating part movably mounted through the fixing hole;

a squeezing part connected to the penetrating part, an outer diameter of the squeezing part larger than an inner diameter of the fixing hole; and a spacer squeezed between the squeezing part and the lateral wall of the connecting sleeve.

9. The test terminal as claimed in claim 5, wherein:

the connecting sleeve further has:

an engaging hole formed through a lateral wall of the connecting sleeve and spatially communicating with the first slot; and the main sleeve further has:

an engaging recess formed on the outer annular surface of the main sleeve, the engaging recess located in the first slot and spatially communicating with the engaging hole; and an engaging unit engaged in the engaging recess and the engaging hole.

10. The test terminal as claimed in claim 8, wherein:

the connecting sleeve further has:

an engaging hole formed through the lateral wall of the connecting sleeve and spatially communicating with the first slot; and the main sleeve further has:

an engaging recess formed on the outer annular surface of the main sleeve, the engaging recess located in the first slot and spatially communicating with the engaging hole; and an engaging unit engaged in the engaging recess and the engaging hole.

11. The test terminal as claimed in claim 1, wherein:

the at least one installation hole has an expanding section; an inner diameter of the expanding section is enlarged from the bottom surface to the top surface of the first connecting unit, and thereby the expanding section has an inner annular surface which is inclined with respect to the main sleeve; and the connecting sleeve has an outer annular surface which is inclined with respect to the main sleeve, and the outer annular surface of the connecting sleeve fits with and detachably contacts the inner annular surface of the expanding section.

12. The test terminal as claimed in claim 11, wherein:

the main sleeve of the at least one probe assembly further has:

a limit groove recessed from the outer annular surface of the main sleeve, and the limit groove located in the at least one installation hole of the first connecting unit; and the connecting assembly further has:

at least one pin mounted through the first connecting unit and passing the limit groove of the main sleeve.

13. The test terminal as claimed in claim 12, wherein:

the first connecting unit and the second connecting unit are integrally formed together.

14. The test terminal as claimed in claim 1, wherein, the main sleeve of each of the at least one probe assembly further has:

a sign disposed on the outer annular surface of the main sleeve, and the sign configured to mark a degree of deformation of the buffering module.

15. The test terminal as claimed in claim 10, wherein, the main sleeve of each of the at least one probe assembly further has:

a sign disposed on the outer annular surface of the main sleeve, and the sign configured to mark a degree of deformation of the buffering module.

16. The test terminal as claimed in claim 13, wherein, the main sleeve of each of the at least one probe assembly further has:

a sign disposed on the outer annular surface of the main sleeve, and the sign configured to mark a degree of deformation of the buffering module.

* * * * *